(12) United States Patent
MacLennan

(10) Patent No.: US 8,416,052 B2
(45) Date of Patent: Apr. 9, 2013

(54) MEDIUM / HIGH VOLTAGE INDUCTOR APPARATUS AND METHOD OF USE THEREOF

(76) Inventor: Grant A. MacLennan, Scottsdale, AZ (US)

(*) Notice: Subject to any disclaimer, the term of this patent is extended or adjusted under 35 U.S.C. 154(b) by 0 days.

(21) Appl. No.: 13/363,207

(22) Filed: Jan. 31, 2012

(65) Prior Publication Data
US 2012/0139680 A1 Jun. 7, 2012

Related U.S. Application Data

(60) Division of application No. 13/150,940, filed on Jun. 1, 2011, which is a continuation-in-part of application No. 13/107,828, filed on May 13, 2011, which is a continuation-in-part of application No. 12/098,880, filed on Apr. 7, 2008, now Pat. No. 7,973,628, which is a continuation-in-part of application No. 11/156,080, filed on Jun. 17, 2005, now Pat. No. 7,471,181, which is a continuation-in-part of application No. 12/197,034, filed on Aug. 22, 2008, now Pat. No. 8,009,008, which is a continuation-in-part of application No. 12/434,894, filed on May 4, 2009, now Pat. No. 7,973,632, which is a continuation-in-part of application No. 12/206,584, filed on Sep. 8, 2008, now Pat. No. 7,855,629.

(60) Provisional application No. 60/910,333, filed on Apr. 5, 2007, provisional application No. 60/580,922, filed on Jun. 17, 2004, provisional application No. 60/957,371, filed on Aug. 22, 2007, provisional application No. 61/050,084, filed on May 2, 2008.

(51) Int. Cl.
*H01F 27/24* (2006.01)

(52) U.S. Cl.
USPC .......................................................... 336/233

(58) Field of Classification Search .................. 336/233, 336/65, 90, 92, 206–208, 210; 29/602.1; 252/62.54
See application file for complete search history.

(56) References Cited

U.S. PATENT DOCUMENTS

| | | |
|---|---|---|
| 3,374,452 A | 3/1968 | Judd |
| 3,377,582 A | 4/1968 | Rogers |
| 3,668,589 A | 6/1972 | Wilkinson |
| 4,393,435 A | 7/1983 | Petrina |
| 4,547,713 A | 10/1985 | Langley |
| 4,639,626 A | 1/1987 | McGee |
| 4,710,667 A | 12/1987 | Whiteley |
| 4,806,895 A | 2/1989 | Petrow |

(Continued)

FOREIGN PATENT DOCUMENTS
DE 3047603 A1 7/1982

*Primary Examiner* — Tuyen Nguyen
(74) *Attorney, Agent, or Firm* — Kevin Hazen

(57) ABSTRACT

The invention comprises an inductor configured for filtering medium and/or high voltage power. The inductor includes an inductor core formed of a plurality of coated magnetic particles, each of a majority of the coated magnetic particles including: a magnetic particle core and a non-magnetic coating about a corresponding magnetic particle core. The inductor optionally includes: (1) a main inductor spacer separating a first turn of a winding from a terminal turn of the winding and (2) a segmenting spacer separating two consecutive turns of the winding about said core. The inductor is configured to convert power into an output current, such as power of at least one thousand five hundred volts with an input current of at least fifty amperes.

4 Claims, 15 Drawing Sheets

U.S. PATENT DOCUMENTS

| | | | |
|---|---|---|---|
| 5,256,211 A | 10/1993 | Silgailis | |
| 5,307,043 A | 4/1994 | Dvorak | |
| 5,444,229 A | 8/1995 | Rudolph | |
| 5,481,238 A | 1/1996 | Carsten | |
| 5,543,674 A | 8/1996 | Koehler | |
| 5,543,773 A | 8/1996 | Evans | |
| 5,565,835 A | 10/1996 | Groehl | |
| 5,651,841 A * | 7/1997 | Moro et al. | 148/309 |
| 5,868,123 A | 2/1999 | Hasegawa | |
| 6,049,266 A | 4/2000 | Hoshino | |
| 6,063,303 A * | 5/2000 | Ohtaki | 252/62.54 |
| 6,154,109 A | 11/2000 | Gold | |
| 6,166,472 A | 12/2000 | Pinkerton | |
| 6,262,651 B1 | 7/2001 | Miyamoto | |
| 6,480,088 B2 | 11/2002 | Okamoto | |
| 6,545,450 B1 | 4/2003 | Ledenev | |
| 6,648,990 B2 | 11/2003 | Yoshizawa | |
| 6,690,257 B2 | 2/2004 | Kobayashi | |
| 6,897,718 B2 | 5/2005 | Yoshida | |
| 7,471,181 B1 | 12/2008 | MacLennan | |
| 7,479,865 B2 | 1/2009 | Feist | |
| 7,498,916 B2 | 3/2009 | Feist | |
| 7,554,431 B2 | 6/2009 | Dahlgren | |
| 7,682,695 B2 * | 3/2010 | Kugai et al. | 428/403 |
| 7,849,586 B2 | 12/2010 | Sutardja | |
| 7,855,629 B2 | 12/2010 | MacLennan | |
| 7,973,628 B1 | 7/2011 | MacLennan | |
| 7,973,632 B2 | 7/2011 | MacLennan | |
| 8,009,008 B2 | 8/2011 | MacLennan | |
| 8,048,191 B2 * | 11/2011 | Lu et al. | 75/255 |
| 8,089,333 B2 | 1/2012 | MacLennan | |
| 8,130,069 B1 | 3/2012 | MacLennan | |
| 8,203,411 B2 | 6/2012 | MacLennan | |
| 2003/0048165 A1 | 3/2003 | Rapoport | |
| 2008/0024259 A1 | 1/2008 | Chandrasekaran | |
| 2009/0045898 A1 | 2/2009 | MacLennan | |
| 2009/0267720 A1 | 10/2009 | MacLennan | |
| 2011/0227670 A1 | 9/2011 | MacLennan | |
| 2011/0227680 A1 | 9/2011 | MacLennan | |
| 2011/0227681 A1 | 9/2011 | MacLennan | |
| 2011/0227682 A1 | 9/2011 | MacLennan | |
| 2011/0234352 A1 | 9/2011 | MacLennan | |
| 2011/0267161 A1 | 11/2011 | MacLennan | |

* cited by examiner

MEDIUM / HIGH VOLTAGE INDUCTOR APPARATUS AND METHOD OF USE THEREOF

CROSS REFERENCES TO RELATED APPLICATIONS

This application is a divisional of U.S. patent application Ser. No. 13/150,940 filed Jun. 1, 2011, which is a continuation-in-part of U.S. patent application Ser. No. 13/107,828 filed May 13, 2011, which
  is a continuation-in-part of U.S. patent application Ser. No. 12/098,880 filed Apr. 7, 2008, now U.S. Pat. No.7,973,628 which
    claims benefit of U.S. provisional patent application No. 60/910,333 filed Apr. 5, 2007; and
  is a continuation-in-part of U.S. patent application Ser. No. 11/156,080 filed Jun. 17, 2005 (now U.S. Pat. No. 7,471,181), which claims benefit of U.S. provisional patent application No. 60/580,922 filed Jun. 17, 2004;
  is a continuation-in-part of U.S. patent application Ser. No. 12/197,034 filed Aug. 22, 2008, now U.S. Pat. No.8,009,008 which claims benefit of U.S. provisional patent application No. 60/957,371, filed on Aug. 22, 2007; and
  is a continuation-in-part of U.S. patent application Ser. No. 12/434,894 filed May 4, 2009, now U.S. Pat. No. 7,973,632 which
    is a continuation-in-part of U.S. patent application Ser. No. 12/206,584 filed Sep. 8, 2008 (now U.S. Pat. No. 7,855,629); and
  claims benefit of U.S. provisional patent application Ser. No. 61/050,084, filed May 2, 2008,
all of which are incorporated herein in their entirety by this reference thereto.

BACKGROUND OF THE INVENTION

1. Field of the Invention

The invention relates to a power converter method and apparatus.

2. Discussion of the Prior Art

Power is generated from a number of sources. The generated power is necessarily converted, such as before entering the power grid or prior to use. In many industrial applications, electromagnetic components, such as inductors and capacitors, are used in power filtering. Important factors in the design of power filtering methods and apparatus include cost, size, efficiency, resonant points, inductor impedance, inductance at desired frequencies, and/or inductance capacity.

What is needed is a more efficient inductor apparatus and method of use thereof.

SUMMARY OF THE INVENTION

The invention comprises a distributed gap inductor apparatus and method of use thereof.

BRIEF DESCRIPTION OF THE DRAWINGS

A more complete understanding of the present invention is derived by referring to the detailed description and described embodiments when considered in connection with the following illustrative figures. In the following figures, like reference numbers refer to similar elements and steps throughout the figures.

Figure 1A:
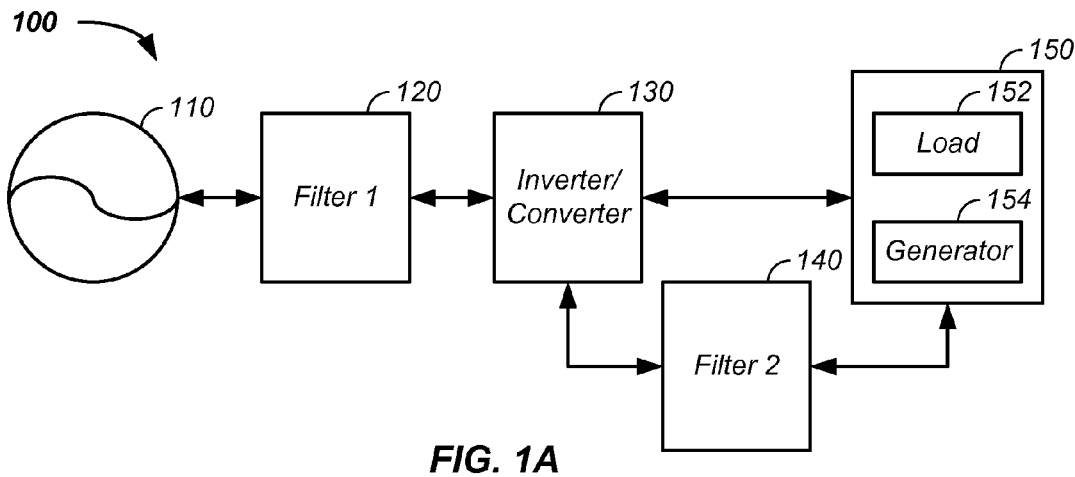
FIGS. 1A, 1B, and 1C, respectively illustrate: a power filtering process, a grid power filtering process, and a process for filtering generated power.

Elements and steps in the figures are illustrated for simplicity and clarity and have not necessarily been rendered according to any particular sequence. For example, steps that are performed concurrently or in different order are illustrated in the figures to help improve understanding of embodiments of the present invention.

DETAILED DESCRIPTION OF EXEMPLARY EMBODIMENTS

The invention comprises a distributed gap inductor apparatus and method of use thereof.

In one embodiment, a distributed gap inductor, for use with medium voltage power, apparatus and method of use thereof is provided.

In another embodiment, an inductor and capacitor array mounting method and apparatus is provided.

In yet another embodiment, an inductor mounting and cooling system is provided.

In still yet another embodiment, an inductor and capacitor array filtering method and apparatus is provided.

In yet still another embodiment, an inductor configured for use with medium voltage power supplies is provided.

Methods and apparatus according to various embodiments preferably operate in conjunction with an inductor and/or a capacitor. For example, an inverter/converter system using at least one inductor and at least one capacitor optionally mounts the electromagnetic components in a vertical format, which reduces space and/or material requirements. In another example, the inductor comprises a substantially annular core and a winding. The inductor is preferably configured for high current applications, such as at or above about 50, 100, or 200 amperes and/or for medium voltage or mid-level power systems, such as power systems operating at about 2,000 to 5,000 volts. In yet another example, a capacitor array is preferably used in processing a provided power supply.

Embodiments are described partly in terms of functional components and various assembly and/or operating steps. Such functional components are optionally realized by any number of components configured to perform the specified functions and to achieve the various results. For example, embodiments optionally use various elements, materials, coils, cores, filters, supplies, loads, passive components, and/or active components, which optionally carry out functions related to those described. In addition, embodiments described herein are optionally practiced in conjunction with any number of applications, environments, and/or passive circuit elements. The systems and components described herein merely exemplify applications. Further, embodiments described herein optionally use any number of conventional techniques for manufacturing, assembling, connecting, and/or operation. Components, systems, and apparatus described herein are optionally used in any combination and/or permutation.

Electrical System

An electrical system preferably includes an electromagnetic component operating in conjunction with an electric current to create a magnetic field, such as with a transformer, an inductor, and/or a capacitor array. In one embodiment, the electrical system comprises an inverter/converter system having a filter circuit, such as a low pass filter and/or a high pass filter. The power supply or inverter/converter comprises any suitable power supply or inverter/converter, such as an inverter for a variable speed drive, an adjustable speed drive, and/or an inverter/converter that provides power from an energy device. Examples of an energy device include an electrical transmission line, a generator, a turbine, a battery, a flywheel, a fuel cell, a solar cell, a wind turbine, use of a biomass, and/or any high frequency inverter or converter system.

The electrical system described herein is optionally adaptable for any suitable application or environment, such as variable speed drive systems, uninterruptible power supplies, backup power systems, inverters, and/or converters for renewable energy systems, hybrid energy vehicles, tractors, cranes, trucks and other machinery using fuel cells, batteries, hydrogen, wind, solar, biomass and other hybrid energy sources, regeneration drive systems for motors, motor testing regenerative systems, and other inverter and/or converter applications. Backup power systems optionally include, for example, superconducting magnets, batteries, and/or flywheel technology. Renewable energy systems optionally include any of: solar power, a fuel cell, a wind turbine, hydrogen, use of a biomass, and/or a natural gas turbine.

In various embodiments, the electrical system is adaptable for energy storage or a generation system using direct current (DC) or alternating current (AC) electricity configured to backup, store, and/or generate distributed power. Various embodiments described herein are particularly suitable for high current applications, such as currents greater than about one hundred amperes (A), currents greater than about two hundred amperes, and more particularly currents greater than about four hundred amperes. Embodiments described herein are also suitable for use with electrical systems exhibiting multiple combined signals, such as one or more pulse width modulated (PWM) higher frequency signals superimposed on a lower frequency waveform. For example, a switching element may generate a PWM ripple on a main supply waveform. Such electrical systems operating at currents greater than about one hundred amperes operate within a field of art substantially different than low power electrical systems, such as those operating at sub-ampere levels or at about 2, 5, 10, 20, or 50 amperes.

Various embodiments are optionally adapted for high-current inverters and/or converters. An inverter produces alternating current from a direct current. A converter processes AC or DC power to provide a different electrical waveform. The term converter denotes a mechanism for either processing AC power into DC power, which is a rectifier, or deriving power with an AC waveform from DC power, which is an inverter. An inverter/converter system is either an inverter system or a converter system. Converters are used for many applications, such as rectification from AC to supply electrochemical processes with large controlled levels of direct current, rectification of AC to DC followed by inversion to a controlled frequency of AC to supply variable-speed AC motors, interfacing DC power sources, such as fuel cells and photoelectric devices, to AC distribution systems, production of DC from AC power for subway and streetcar systems, for controlled DC voltage for speed-control of DC motors in numerous industrial applications, and/or for transmission of DC electric power between rectifier stations and inverter stations within AC generation and transmission networks.

Filtering

Referring now to FIG. 1A, a power processing system 100 is provided. In a first case, AC grid 110 current or power is processed to provide output current or output power 150, such as to a load 152. In a second case, generated power 154 is processed, such as for delivery to the AC grid 110. In the first case, a first filter 120 is used to protect the AC grid from energy reflected from an inverter/converter 130, such as to meet or exceed IEEE 519 requirements for grid transmission. Subsequently, the electricity is further filtered, such as with a second filter 140 or is provided to the load 152. In the second case, the generated power 154 is provided to the inverter/converter 130 and subsequently filtered, such as with the first filter 120 before supplying the power to the AC grid 110. Examples for each of these cases are further described, infra.

Figure 1B:
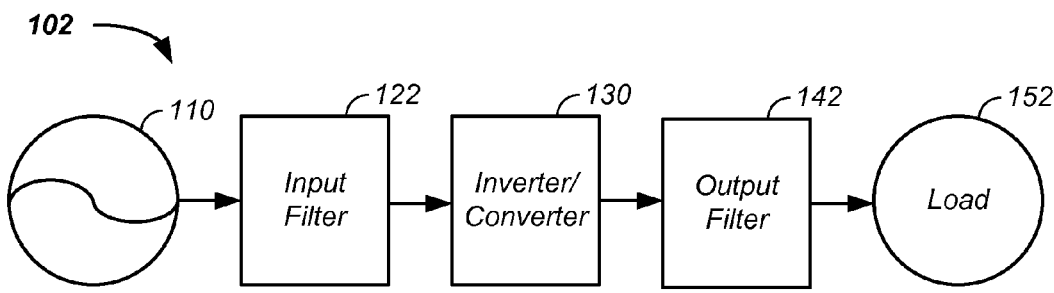

Referring now to FIG. 1B, an example of processing AC power 102 from the AC grid 110 is provided. In this case, electricity flows from the AC grid 110 to the load 152. In this example, AC power from the AC grid 110 is passed through an input filter 122 to the inverter/converter 130. The input filter 122 uses at least one inductor and optionally uses at least one capacitor and/or other electrical components. The input filter functions to protect quality of power on the AC grid 110 from harmonics or energy reflected from the inverter/converter 130 and/or to filter power from the AC grid 110. Output from the inverter/converter 130 is subsequently passed through an output filter 142. The output filter 142 includes at least one inductor and optionally includes one or more additional electrical components, such as one or more capacitors. Output from the output filter 142 is subsequently delivered to the load 152, such as to a motor, chiller, or pump. In a first instance, the load 152 is an inductor motor, such as an inductor motor operating at about 50 or 60 Hz. In a second instance, the load 152 is a permanent magnet motor, such as a motor having a fundamental frequency of about 250 to 1000 Hz.

Figure 1C:
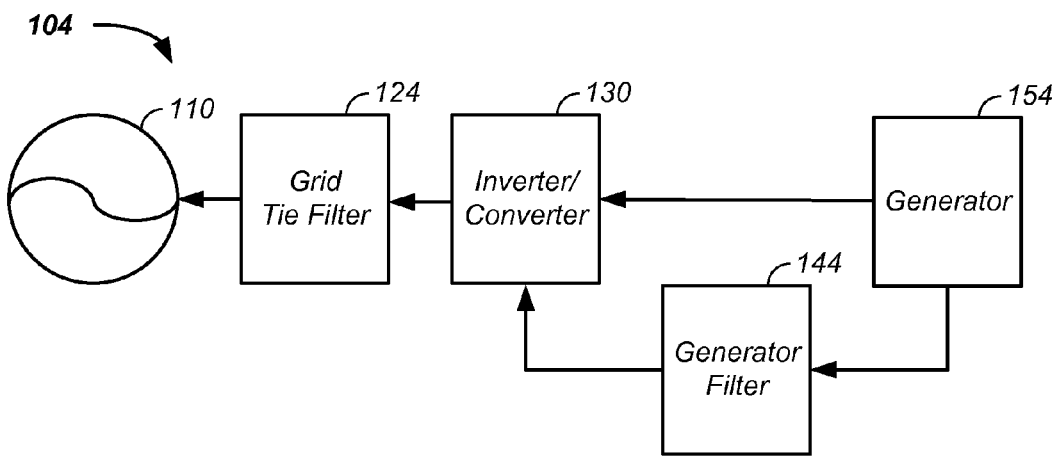

Referring now to FIG. 1C, an example of processing generated power from the generator 154 is provided. In this case, electricity flows from the generator 154 to the AC grid 110. The generator 154 provides power to the inverter/converter 130. Optionally, the generated power is processed through a generator filter 144 before delivery to the inverter/converter 130. Power from the inverter/converter 130 is filtered with a grid tie filter 124, which includes at least one inductor and optionally includes one or more additional electrical components, such as a capacitor. Output from the grid tie filter 124 is delivered to the AC grid 110. A first example of a grid tie filter 124 is a filter using an inductor. A second example of a grid tie filter 124 is a filter using a first inductor, a capacitor, and a second inductor for each phase of power. Optionally, output from the inverter/converter 130 is filtered using at least one inductor and passed directly to a load, such as a motor.

In the power processing system 100, the power supply system or input power includes any other appropriate elements or systems, such as a voltage or current source and a switching system or element. The supply optionally operates in conjunction with various forms of modulation, such as pulse width modulation, resonant conversion, quasi-resonant conversion, and/or phase modulation.

Filter circuits in the power processing system 100 are configured to filter selected components from the supply signal. The selected components include any elements to be attenuated or eliminated from the supply signal, such as noise and/or harmonic components. For example, filter circuits reduce total harmonic distortion. In one embodiment, the filter circuits are configured to filter higher frequency harmonics over the fundamental frequency. Examples of fundamental frequencies include: direct current (DC), 50 Hz, 60 Hz, and/or 400 Hz signals. Examples of higher frequency harmonics include harmonics over about 300, 500, 600, 800, 1000, or 2000 Hz in the supply signal, such as harmonics induced by the operating switching frequency of insulated gate bipolar transistors (IGBTs) and/or any other electrically operated switches. The filter circuit optionally includes passive components, such as an inductor-capacitor filter comprised of an inductor, a capacitor, and in some embodiments a resistor. The values and configuration of the inductor and the capacitor are selected according to any suitable criteria, such as to configure the filter circuits to a selected cutoff frequency, which determines the frequencies of signal components filtered by the filter circuit. The inductor is preferably configured to operate according to selected characteristics, such as in conjunction with high current without excessive heating or operating within safety compliance temperature requirements.

Power Processing System

The power processing system 100 is optionally used to filter single or multi-phase power, such as three phase power. Herein, for clarity of presentation AC input power from the grid 110 or input power 112 is used in the examples. Though not described in each example, the components and/or systems described herein additionally apply generator systems, such as the system for processing generated power.

Figure 2:
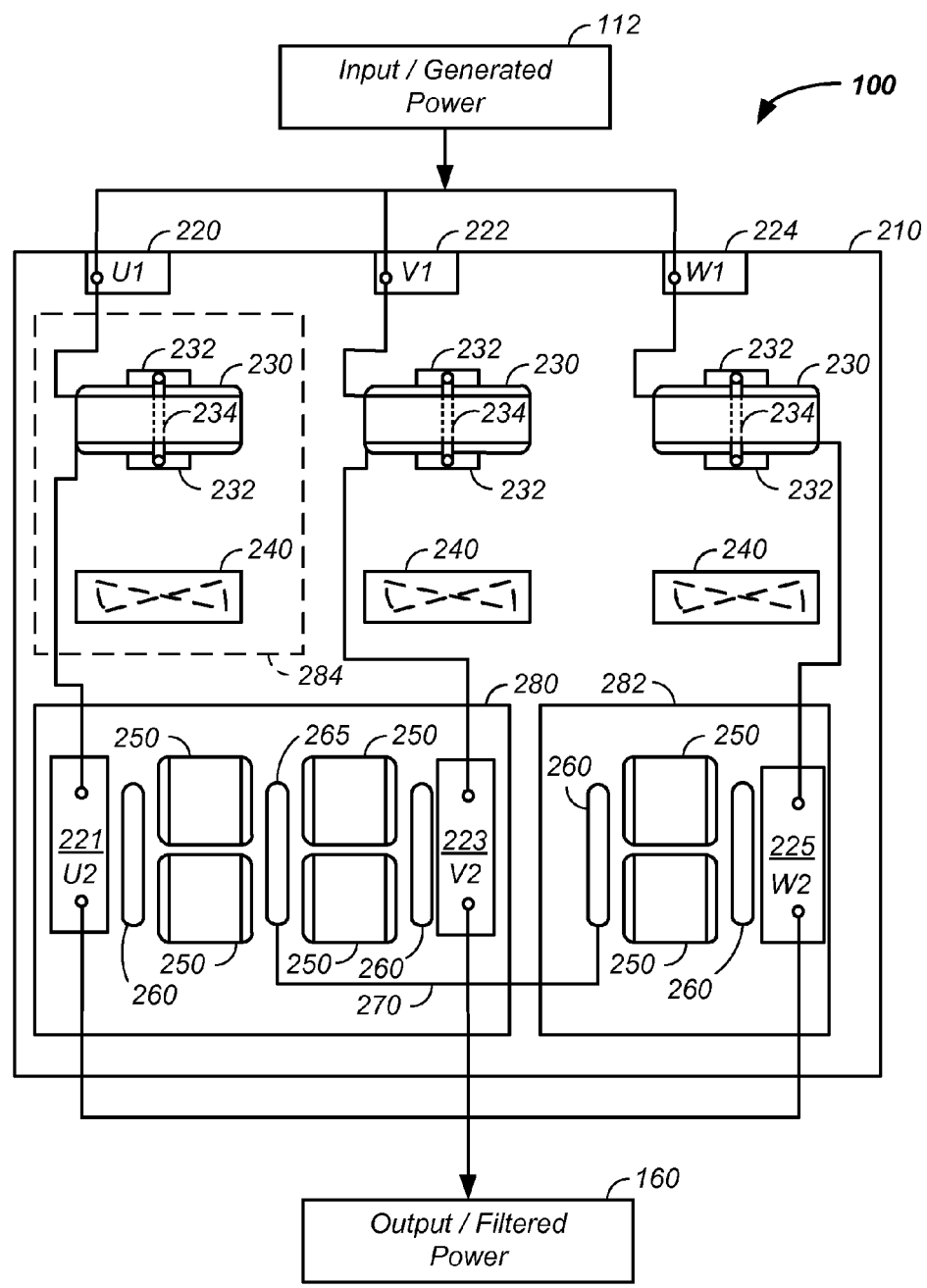
FIG. 2 illustrates multi-phase inductor/capacitor component mounting and a filter circuit for power processing.

Referring now to FIG. 2, an illustrative example of multi-phase power filtering is provided. Input power 112 is processed using the power processing system 100 to yield filtered and/or transformed output power 160. In this example, three-phase power is processed. The three phases, of the three-phase input power, are denoted U1, V1, and W1. The input power 112 is connected to a corresponding phase terminal U1 220, V1 222, and/or W1 224, where the phase terminals are connected to or integrated with the power processing system 100. For clarity, processing of a single phase is described, which is illustrative of multi-phase power processing. The input power 112 is then processed by sequential use of an inductor 230 and a capacitor 250. The inductor and capacitor system is further described, infra. After the inductor/capacitor processing, the three phases of processed power, corresponding to U1, V1, and W1 are denoted U2, V2, and W2, respectively. The power is subsequently output as the processed and/or filtered power 150. Additional elements of the power processing system 100, in terms of the inductor 230, a cooling system 240, and mounting of the capacitors 250, are further described infra.

Isolators

Figure 3:
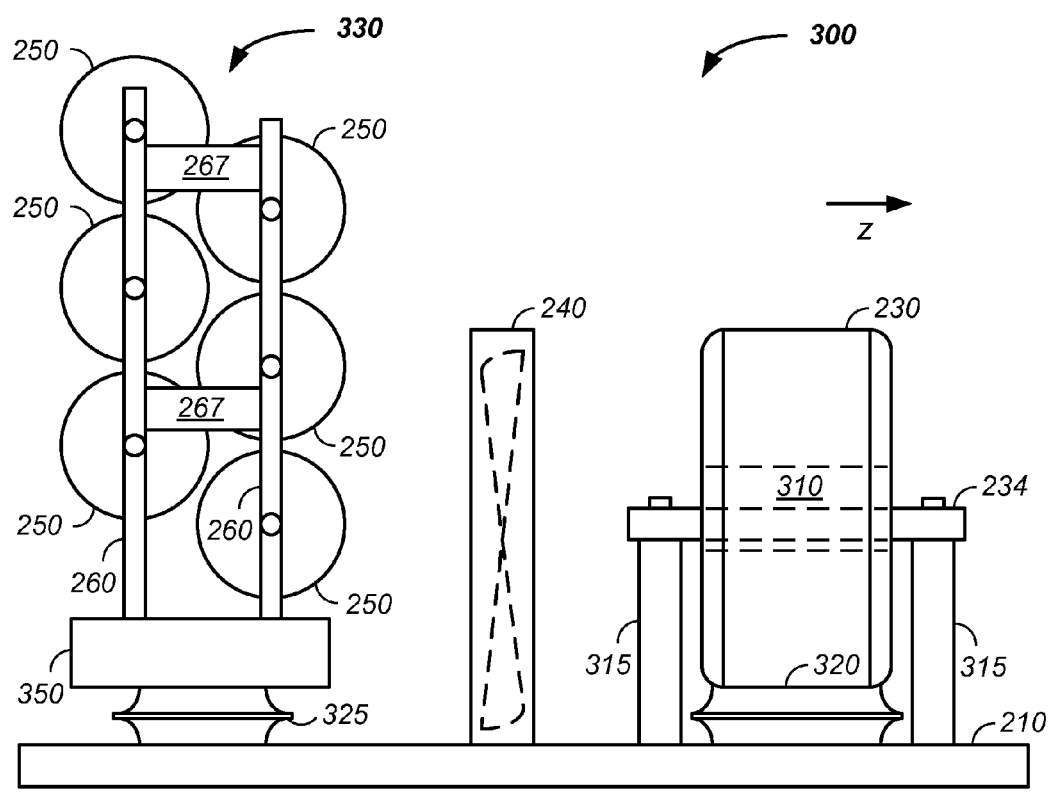
FIG. 3 further illustrates capacitor mounting.

Referring still to FIG. 2 and now to FIG. 3, in the power processing system 100, the inductor 230 is optionally mounted, directly or indirectly, to a base plate 210 via a mount 232, via an inductor isolator 320, and/or via a mounting plate 284. Preferably, the inductor isolator 320 is used to attach the mount 232 indirectly to the base plate 210. The inductor 230 is additionally preferably mounted using a cross-member or clamp bar 234 running through a central opening 310 in the inductor 230. The capacitor 250 is preferably similarly mounted with a capacitor isolator 325 to the base plate 210. The isolators 320, 325 are preferably vibration, shock, and/or temperature isolators. The isolators 320, 325 are preferably a glass-reinforced plastic, a glass fiber-reinforced plastic, a fiber reinforced polymer made of a plastic matrix reinforced by fine fibers made of glass, and/or a fiberglass material, such as a Glastic® (Rochling Glastic Composites, Ohio) material.

Cooling System

Figure 4:
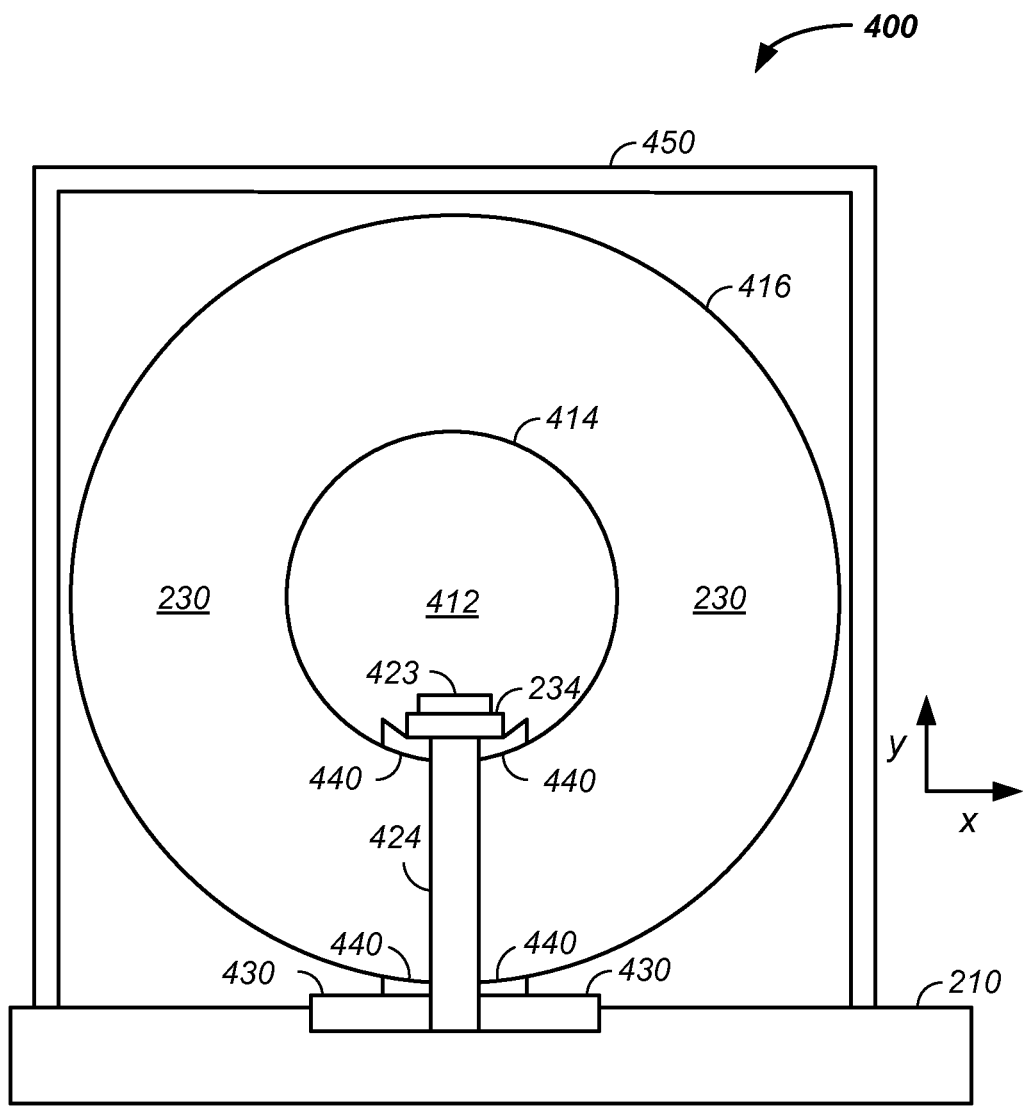
FIG. 4 illustrates a face view of an inductor.

Referring still to FIG. 2 and now to FIG. 4, an optional cooling system 240 is used in the power processing system 100. In the illustrated embodiment, the cooling system 240 uses a fan to move air across the inductor 230. The fan either pushes or pulls an air flow around and through the inductor 230. An optional air guide shroud 450 is placed over 1, 2, 3, or more inductors 230 to facilitate focused air movement resultant from the cooling system 240, such as airflow from a fan, around the inductors 230. The shroud preferably encompasses at least three sides of the one or more inductors. To achieve enhanced cooling, the inductor is preferably mounted on an outer face 416 of the toroid. For example, the inductor 230 is mounted in a vertical orientation using the clamp bar 234. Vertical mounting of the inductor is further described, infra. Optional liquid based cooling systems 240 are further described, infra.

Buss Bars

Referring again to FIG. 2 and FIG. 3, in the power processing system 100, the capacitor 250 is preferably an array of capacitors connected in parallel to achieve a specific capacitance for each of the multi-phases of the power supply 110. In FIG. 2, two capacitors 250 are illustrated for each of the multi-phased power supply U1, V1, and W1. The capacitors are mounted using a series of busbars or buss bars 260. A buss bar 260 carries power from one point to another or connects one point to another.

Common Neutral Buss bar

A particular type of buss bar 260 is a common neutral buss bar 265, which connects two phases. In one example of an electrical embodiment of a delta capacitor connection in a poly phase system, it is preferable to create a common neutral point for the capacitors. Still referring to FIG. 2, an example of two phases using multiple capacitors in parallel with a common neutral buss bar 265 is provided. The common neutral buss bar 265 functions as both a mount and a parallel bus conductor for two phases. This concept minimizes the number of parallel conductors, in a 'U' shape or in a parallel '| |' shape in the present embodiment, to the number of phases plus two. In a traditional parallel buss bar system, the number of buss bars 260 used is the number of phases multiplied by two or number of phases times two. Hence, the use of 'U' shaped buss bars 260 reduces the number of buss bars used compared to the traditional mounting system. Minimizing the number of buss bars required to make a poly phase capacitor assembly, where multiple smaller capacitors are positioned in parallel to create a larger capacitance, minimizes the volume of space needed and the volume of buss bar conductors. Reduction in buss bar 260 volume and/or quantity minimizes cost of the capacitor assembly. After the two phases that share a common neutral bus conductor are assembled, a simple jumper 270 bus conductor is optionally used to jumper those two phases to any quantity of additional phases as shown in FIG. 2. The jumper optionally includes as little as two connection points. The jumper optionally functions as a handle on the capacitor assembly for handling. It is also typical that this common neutral bus conductor is the same shape as the other parallel bus conductors throughout the capacitor assembly. This common shape theme, a 'U' shape in the present embodiment, allows for symmetry of the assembly in a poly phase structure as shown in FIG. 2.

Parallel Buss Bars Function as Mounting Chassis

Herein, the buss bars 260, 265 preferably mechanically support the capacitors 250. The use of the buss bars 260, 265 for mechanical support of the capacitors 250 has several benefits. The parallel conducting buss bar connecting multiple smaller value capacitors to create a larger value, which can be used in a 'U' shape, also functions as a mounting chassis. Incorporating the buss bar as a mounting chassis removes the requirement of the capacitor 250 to have separate, isolated mounting brackets. These brackets typically would mount to a ground point or metal chassis in a filter system. In the present embodiment, the capacitor terminals and the parallel buss bar support the capacitors and eliminate the need for expensive mounting brackets and additional mounting hardware for these brackets. This mounting concept allows for optimal vertical or horizontal packaging of capacitors.

Parallel Buss Bar

A parallel buss bar is optionally configured to carry smaller currents than an input/output terminal. The size of the buss bar 260 is minimized due to its handling of only the capacitor current and not the total line current, where the capacitor current is less than about 10, 20, 30, or 40 percent of the total line current. The parallel conducting buss bar, which also functions as the mounting chassis, does not have to conduct full line current of the filter. Hence the parallel conducting buss bar is optionally reduced in cross-section area when compared to the output terminal 350. This smaller sized buss bar reduces the cost of the conductors required for the parallel configuration of the capacitors by reducing the conductor material volume. The full line current that is connected from the inductor to the terminal is substantially larger than the current that travels through the capacitors. For example, the capacitor current is less than about 10, 20, 30, or 40 percent of the full line current. In addition, when an inductor is used that impedes the higher frequencies by about 20, 100, 200, 500, 1000, 1500, or 2000 KHz before they reach the capacitor buss bar and capacitors, this parallel capacitor current is lower still than when an inferior filter inductor, whose resonant frequency is below 5, 10, 20, 40, 50, 75, 100 KHz, is used which cannot impede the higher frequencies due to its high internal capacitive construction or low resonant frequency. In cases where there exist high frequency harmonics and the inductor is unable to impede these high frequencies, the capacitors must absorb and filter these currents which causes them to operate at higher temperatures, which decreases the capacitors usable life in the circuit. In addition, these un-impeded frequencies add to the necessary volume requirement of the capacitor buss bar and mounting chassis, which increases cost of the power processing system 100.

Staggered Capacitor Mounting

Use of a staggered capacitor mounting system reduces and/or minimizes volume requirements for the capacitors.

Figure 15:
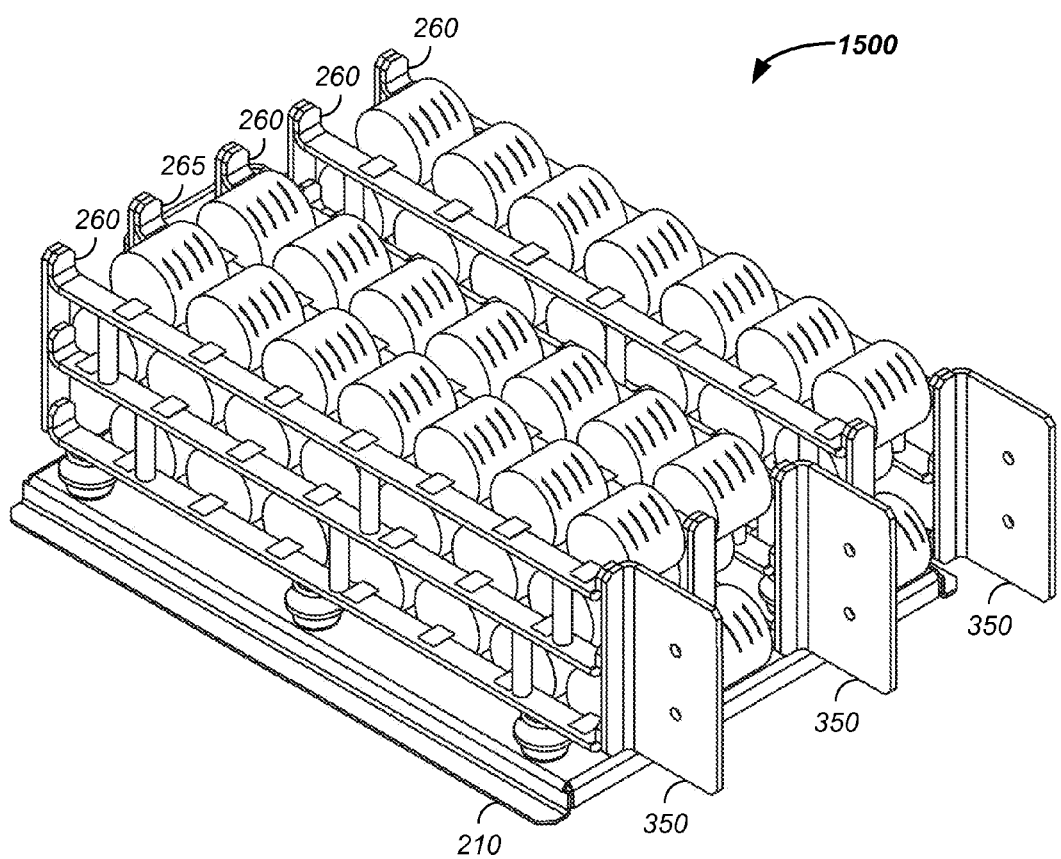
FIG. 15 illustrates a capacitor array.

Referring now to FIG. 3, a filter system 300 is illustrated. The filter system 300 preferably includes a mounting plate or base plate 210. The mounting plate 210 attaches to the inductor 230 and a set of capacitors 330. The capacitors are preferably staggered in an about close packed arrangement having a spacing between rows and staggered columns of less than about 0.25, 0.5, or 1 inch. The staggered packaging allows optimum packaging of multiple smaller value capacitors in parallel creating a larger capacitance in a small, efficient space. Buss bars 260 are optionally used in a 'U' shape or a parallel '| |' shape to optimize packaging size for a required capacitance value. The 'U' shape with staggered capacitors 250 are optionally mounted vertically to the mounting surface, as shown in FIG. 3 or horizontally to the mounting surface as shown in FIG. 15. The 'U' shape buss bar is optionally two about parallel bars with one or more optional mechanical stabilizing spacers, 267, at selected locations to mechanically stabilize both about parallel sides of the 'U' shape buss bar as the buss bar extends from the terminal 350, as shown in FIG. 3 and FIG. 15.

In this example, the capacitor bus work 260 is in a 'U' shape that fastens to a terminal 350 attached to the base plate 210 via an insulator 325. The 'U' shape is formed by a first buss bar 260 joined to a second buss bar 260 via the terminal 350. The 'U' shape is alternatively shaped to maintain the staggered spacing, such as with an m by n array of capacitors, where m and n are integers, where m and n are each two or greater. The buss bar matrix or assembly contains neutral points 265 that are preferably shared between two phases of a poly-phase system. The neutral buss bars 260, 265 connect to all three-phases via the jumper 270. The shared buss bar 265 allows the poly-phase system to have x+2 buss bars where x is the number of phases in the poly-phase system instead of the traditional two buss bars per phase in a regular system. Optionally, the common buss bar 265 comprises a metal thickness of approximately twice the size of the buss bar 260. The staggered spacing enhances packaging efficiency by allowing a maximum number of capacitors in a given volume while maintaining a minimal distance between capacitors needed for the optional cooling system 240, such as cooling fans and/or use of a coolant fluid. Use of a coolant fluid directly contacting the inductor 230 is described, infra. The distance from the mounting surface 210 to the bottom or closest point on the body of the second closest capacitor 250, is less than the distance from the mounting surface 210 to the top or furthest point on the body of the closest capacitor. This mounting system is designated as a staggered mounting system for parallel connected capacitors in a single or poly phase filter system.

Module Mounting

In the power processing system 100, modular components are optionally used. For example, a first mounting plate 280 is illustrated that mounts three buss bars 260 and two arrays of capacitors 250 to the base plate 210. A second mounting plate 282 is illustrated that mounts a pair of buss bars 260 and a set of capacitors to the base plate 210. A third mounting plate 284 is illustrated that vertically mounts an inductor and optionally an associated cooling system 240 or fan to the base plate 210. Generally, one or more mounting plates are used to mount any combination of inductor 230, capacitor 240, buss bar 260, and/or cooling system 240 to the base plate 210.

Referring now to FIG. 3, an additional side view example of a power processing system 100 is illustrated. FIG. 3 further illustrates a vertical mounting system 300 for the inductor 230 and/or the capacitor 250. For clarity, the example illustrated in FIG. 3 shows only a single phase of a multi-phase power filtering system. Additionally, wiring elements are removed in FIG. 3 for clarity. Additional inductor 230 and capacitor 250 detail is provided, infra.

Inductor

Preferable embodiments of the inductor 230 are further described herein. Particularly, in a first section, vertical mounting of an inductor is described. In a second section, inductor elements are described.

For clarity, an axis system is herein defined relative to an inductor 230. An x/y plane runs parallel to an inductor face 417, such as the inductor front face 418 and/or the inductor back face 419. A z-axis runs through the inductor 230 perpendicular to the x/y plane. Hence, the axis system is not defined relative to gravity, but rather is defined relative to an inductor 230.

Vertical Inductor Mounting

FIG. 3 illustrates an indirect vertical mounting system of the inductor 230 to the base plate 210 with an optional intermediate vibration, shock, and/or temperature isolator 320. The isolator 320 is preferably a Glastic® material, described supra. The inductor 230 is preferably an edge mounted inductor with a toroidal core, described infra.

Figure 6:
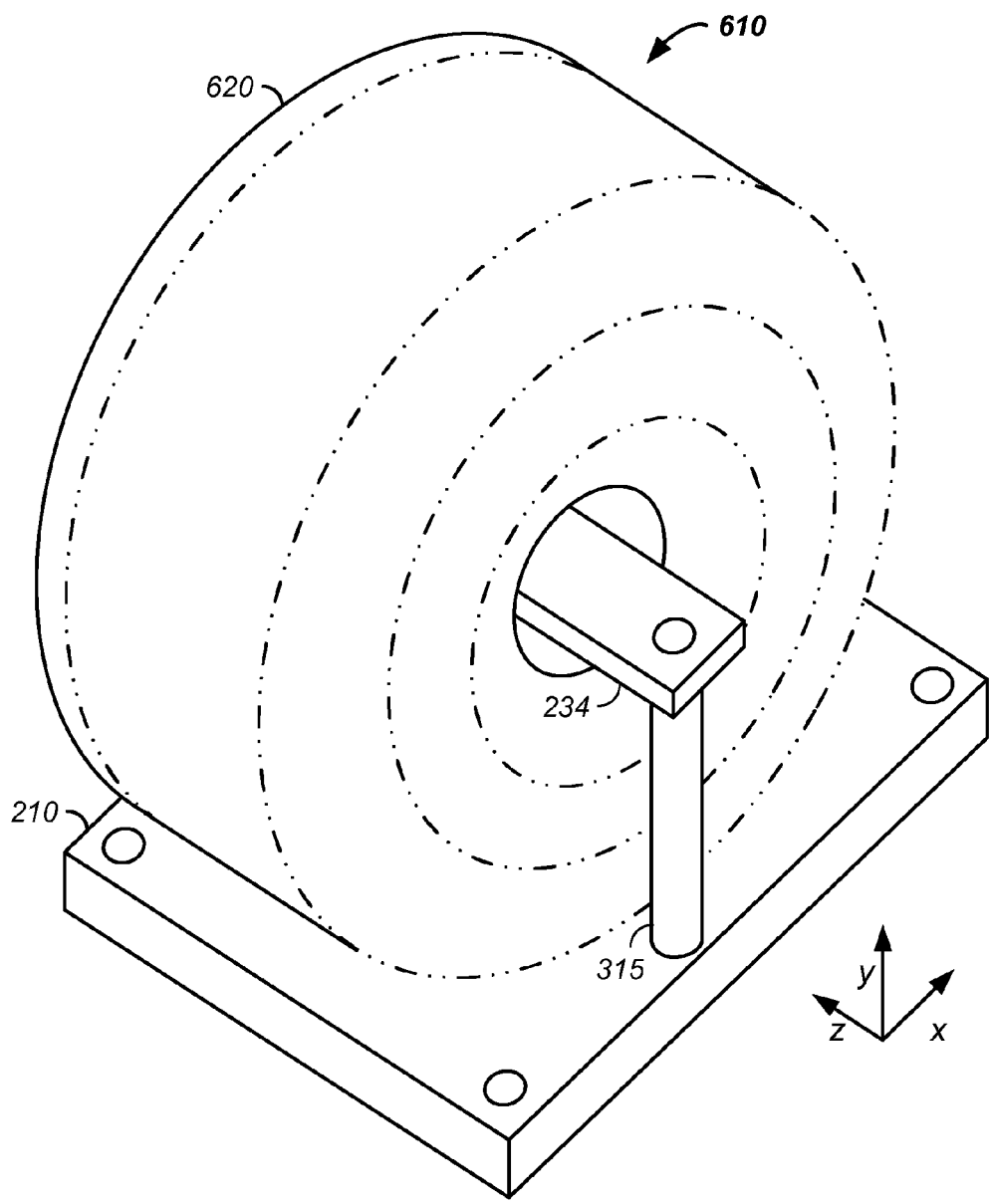
FIG. 6 illustrates an inductor core and an inductor winding.

Referring now to FIG. 6, an inductor 230 optionally includes a core 610 and a winding 620. The winding 620 is wrapped around the core 610. The core 610 and the winding 620 are suitably disposed on a base plate 210 to support the core 610 in any suitable position and/or to conduct heat away from the core 610 and the winding 620. The inductor 610 optionally includes any additional elements or features, such as other items required in manufacturing.

In one embodiment, an inductor 230 or toroidal inductor is mounted on the inductor edge, is vibration isolated, and/or is optionally temperature controlled.

Figure 5:
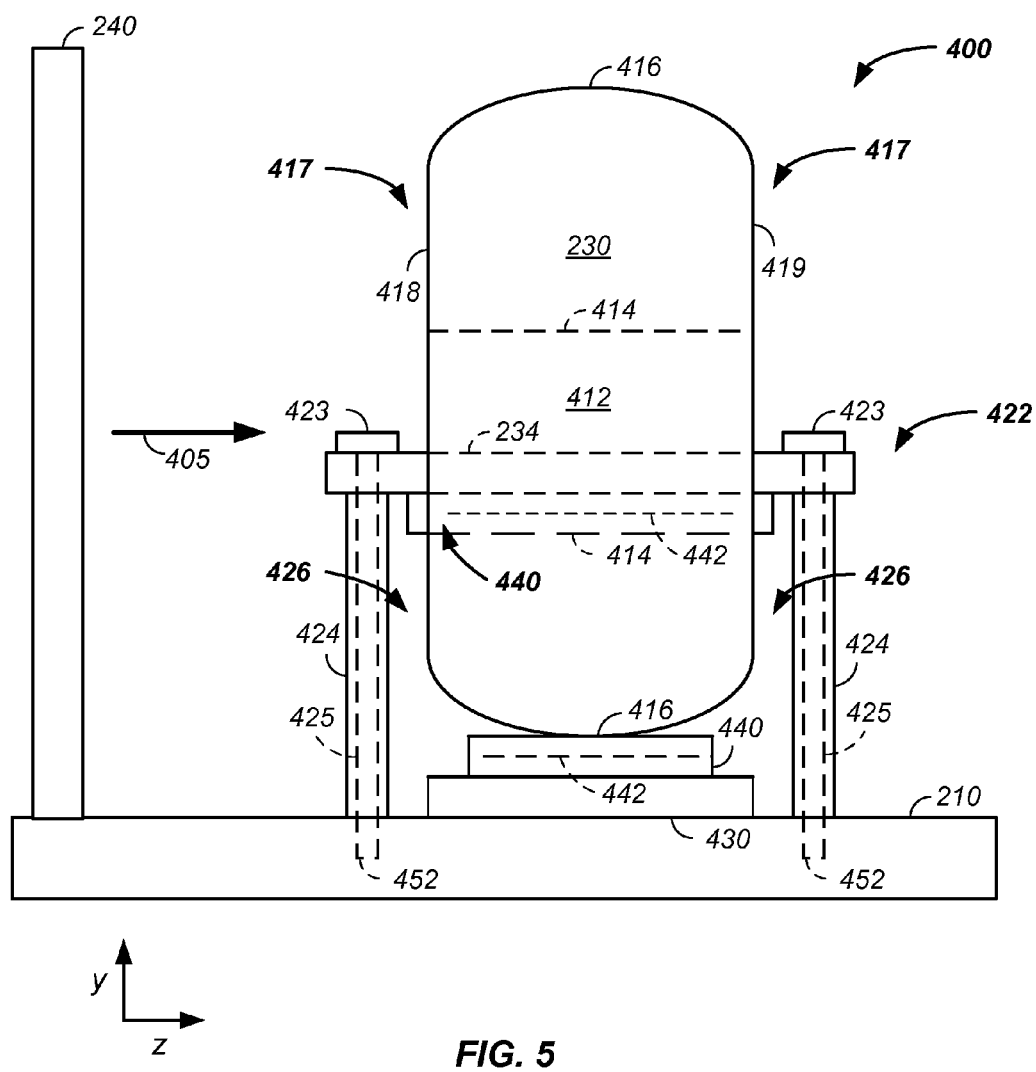
FIG. 5 illustrates a side view of an inductor.

Referring now to FIG. 4 and FIG. 5, an example of an edge mounted inductor system 400 is illustrated. FIG. 4 illustrates an edge mounted toroidal inductor 230 from a face view. FIG. 5 illustrates the inductor 230 from an edge view. When looking through a center hole 412 of the inductor 230, the inductor 230 is viewed from its face. When looking at the inductor 230 along an axis-normal to an axis running through the center hole 412 of the inductor 230, the inductor 230 is viewed from the inductor edge. In an edge mounted inductor system, the edge of the inductor is mounted to a surface. In a face mounted inductor system, the face of the inductor 230 is mounted to a surface. Elements of the edge mounted inductor system 400 are described, infra.

Referring still to FIG. 4, the inductor 230 is optionally mounted in a vertical orientation, where a center line through the center hole 412 of the inductor runs along an axis 405 that is about horizontal or parallel to a mounting surface 430 or base plate 210. The mounting surface is optionally horizontal or vertical, such as parallel to a floor, parallel to a wall, or parallel to a mounting surface on a slope. In FIG. 4, the inductor 230 is illustrated in a vertical position relative to a horizontal mounting surface with the axis 405 running parallel to a floor. While descriptions herein use a horizontal mounting surface to illustrate the components of the edge mounted inductor mounting system 400, the system is equally applicable to a vertical mounting surface. To further clarify, the edge mounted inductor system 400 described herein also applies to mounting the edge of the inductor to a vertical mounting surface or an angled mounting surface. The angled mounting surface is optionally angled at least 10, 20, 30, 40, 50, 60, 70, or 80 degrees off of horizontal. In these cases, the axis 405 still runs about parallel to the mounting surface, such as about parallel to the vertical mounting surface or about parallel to a sloped mounting surface 430, base plate 210, or other surface.

Still referring to FIG. 4 and to FIG. 5, the inductor 230 has an inner surface 414 surrounding the center opening, center aperture, or center hole 412; an outer edge 416 or outer edge surface; and two faces 417, including a front face 418 and a back face 419. An inductor section refers to a portion of the about annular inductor between a point n the inner surface 414 and a closest point on the outer edge 416. The surface of the inductor 230 includes: the inner surface 414, outer edge 416 or outer edge surface, and faces 417. The surface of the inductor 230 is typically the outer surface of the magnet wire windings surrounding the core of the inductor 230. The magnet wire is preferably a wire with an aluminum oxide coating for minimal corona potential. The magnet wire is preferably temperature resistant or rated to at least two hundred degrees Centigrade. The winding of the wire or magnet wire is further described, infra. The minimum weight of the inductor is optionally about 2, 5, 10, or 20 pounds.

Still referring to FIG. 4, an optional clamp bar 234 runs through the center hole 412 of the inductor 230. The clamp bar 234 is preferably a single piece, but is optionally composed of multiple elements. The clamp bar 234 is connected directly or indirectly to the mounting surface 430 and/or to a base plate 210. The clamp bar 234 is composed of a non-conductive material as metal running through the center hole of the inductor 230 functions as a magnetic shorted turn in the system. The clamp bar 234 is preferably a rigid material or a semi-rigid material that bends slightly when clamped, bolted, or fastened to the mounting surface 430. The clamp bar 234 is preferably rated to a temperature of at least 130 degrees Centigrade. Preferably, the clamp bar material is a fiberglass material, such as a thermoset fiberglass-reinforced polyester material, that offers strength, excellent insulating electrical properties, dimensional stability, flame resistance, flexibility, and high property retention under heat. An example of a fiberglass clamp bar material is Glastic®. Optionally the clamp bar 234 is a plastic, a fiber reinforced resin, a woven paper, an impregnated glass fiber, a circuit board material, a high performance fiberglass composite, a phenolic material, a thermoplastic, a fiberglass reinforced plastic, a ceramic, or the like, which is preferably rated to at least 150 degrees Centigrade. Any of the mounting hardware 422 is optionally made of these materials.

Still referring to FIG. 4 and to FIG. 5, the clamp bar 234 is preferably attached to the mounting surface 430 via mounting hardware 422. Examples of mounting hardware include: a bolt, a threaded bolt, a rod, a clamp bar 234, a mounting insulator 424, a connector, a metal connector, and/or a non-metallic connector. Preferably, the mounting hardware is non-conducting. If the mounting hardware 422 is conductive, then the mounting hardware 422 is preferably contained in or isolated from the inductor 230 via a mounting insulator 424. Preferably, an electrically insulating surface is present, such as on the mounting hardware. The electrically insulating surface proximately contacts the faces of the inductor 230. Alternatively, an insulating gap 426 of at least about one millimeter exists between the faces 417 of the inductor 230 and the metallic or insulated mounting hardware 422, such as a bolt or rod.

An example of a mounting insulator is a hollow rod where the outer surface of the hollow rod is non-conductive and the hollow rod has a center channel 425 through which mounting hardware, such as a threaded bolt, runs. This system allows a stronger metallic and/or conducting mounting hardware to connect the clamp bar 234 to the mounting surface 430. FIG. 5 illustrates an exemplary bolt head 423 fastening a threaded bolt into the base plate 210 where the base plate has a threaded hole 452. An example of a mounting insulator 424 is a mounting rod. The mounting rod is preferably composed of a material or is at least partially covered with a material where the material is electrically isolating.

The mounting hardware 422 preferably covers a minimal area of the inductor 230 to facilitate cooling with a cooling element 240, such as via one or more fans. In one case, the mounting hardware 422 does not contact the faces 417 of the inductor 230. In another case, the mounting hardware 422 contacts the faces 417 of the inductor 230 with a contact area. Preferably the contact area is less than about 1, 2, 5, 10, 20, or 30 percent of the surface area of the faces 417. The minimal contact area of the mounting hardware with the inductor surface facilitates temperature control and/or cooling of the inductor 230 by allowing airflow to reach the majority of the inductor 230 surface. Preferably, the mounting hardware is temperature resistant to at least 130 degrees centigrade. Preferably, the mounting hardware 422 comprises curved surfaces circumferential about its length to facilitate airflow around the length of the mounting hardware 422 to the faces 417 of the inductor 230.

Still referring to FIG. 5, the mounting hardware 422 connects the clamp bar 234, which passes through the inductor, to the mounting surface 430. The mounting surface is optionally non-metallic and is rigid or semi-rigid. Generally, the properties of the clamp bar 234 apply to the properties of the mounting surface 430. The mounting surface 430 is optionally (1) composed of the same material as the clamp bar 234 or is (2) a distinct material type from that of the clamp bar 234.

Still referring to FIG. 5, in one example the inductor 230 is held in a vertical position by the clamp bar 234, mounting hardware 422, and mounting surface 430 where the clamp bar 234 contacts the inner surface 414 of the inductor 230 and the mounting surface 430 contacts the outer edge 416 of the inductor 230.

Still referring to FIG. 5, in a second example one or more vibration isolators 440 are used in the mounting system. As illustrated, a first vibration isolator 440 is positioned between the clamp bar 234 and the inner surface 414 of the inductor 230 and a second vibration isolator 440 is positioned between the outer edge 416 of the inductor 230 and the mounting surface 430. The vibration isolator 440 is a shock absorber. The vibration isolator optionally deforms under the force or pressure necessary to hold the inductor 230 in a vertical position or edge mounted position using the clamp bar 234, mounting hardware 422, and mounting surface 430. The vibration isolator preferably is temperature rated to at least two hundred degrees Centigrade. Preferably the vibration isolator 440 is about ⅛, ¼, ⅜, or ½ inch in thickness. An example of a vibration isolator is silicone rubber. Optionally, the vibration isolator 440 contains a glass weave 442 for strength. The vibration isolator optionally is internal to the inductor opening or extends out of the inductor 230 central hole 412.

Still referring to FIG. 5, a common mounting surface 430 is optionally used as a mount for multiple inductors. Alternatively, the mounting surface 430 is connected to a base plate 210. The base plate 210 is optionally used as a base for multiple mounting surfaces connected to multiple inductors, such as three inductors used with a poly-phase power system where one inductor handles each phase of the power system. The base plate 210 optionally supports multiple cooling elements, such as one or more cooling elements per inductor. The base plate is preferably metal for strength and durability. The system reduces cost associated with the mounting surface 430 as the less expensive base plate 210 is used for controlling relative position of multiple inductors and the amount of mounting surface 430 material is reduced and/or minimized. Further, the contact area ratio of the mounting surface 430 to the inductor surface is preferably minimized, such as to less than about 1, 2, 4, 6, 8, 10, or 20 percent of the surface of the inductor 230, to facilitate efficient heat transfer by maximizing the surface area of the inductor 230 available for cooling by the cooling element 240 or by passive cooling.

Still referring to FIG. 4, an optional cooling system 240 is used to cool the inductor. In one example, a fan blows air about one direction, such as horizontally, onto the front face 418, through the center hole 412, along the inner edge 414 of the inductor 230, and/or along the outer edge 416 of the inductor 230 where the clamp bar 234, vibration isolator 440, mounting hardware 422, and mounting surface 430 combined contact less than about 1, 2, 5, 10, 20, or 30 percent of the surface area of the inductor 230, which yields efficient cooling of the inductor 230 using minimal cooling elements and associated cooling element power due to a large fraction of the surface area of the inductor 230 being available for cooling. To aid cooling, an optional shroud 450 about the inductor 230 guides the cooling air flow about the inductor 230 surface. The shroud 450 optionally circumferentially encloses the inductor along 1, 2, 3, or 4 sides. The shroud 450 is optionally any geometric shape.

Preferably, mounting hardware 422 is used on both sides of the inductor 230. Optionally, the inductor 230 mounting hardware 422 is used beside only one face of the inductor 230 and the clamp bar 234 or equivalent presses down or hooks over the inductor 230 through the hole 412 or over the entire inductor 230, such as over the top of the inductor 230.

In yet another embodiment, a section or row of inductors 230 are elevated in a given airflow path. In this layout, a single airflow path or thermal reduction apparatus is used to cool a maximum number of toroid filter inductors in a filter circuit, reducing additional fans or thermal management systems required as well as overall packaging size. This increases the robustness of the filter with fewer moving parts to degrade as well as minimizes cost and packaging size. The elevated layout of a first inductor relative to a second inductor allows air to cool inductors in the first row and then to also cool inductors in an elevated rear row without excessive heating of the air from the front row and with a single airflow path and direction from the thermal management source. Through elevation, a single fan is preferably used to cool a plurality of inductors approximately evenly, where multiple fans would have been needed to achieve the same result. This efficient concept drastically reduces fan count and package size and allows for cooling airflow in a single direction.

An example of an inductor mounting system is provided. Preferably, the pedestal or non-planar base plate, on which the inductors are mounted, is made out of any suitable material. In the current embodiment, the pedestal is made out of sheet metal and fixed to a location behind and above the bottom row of inductors. Multiple orientations of the pedestal and/or thermal management devices are similarly implemented to achieve these results. In this example, toroid inductors mounted on the pedestal use a silicone rubber shock absorber mounting concept with a bottom plate, base plate, mounting hardware 122, a center hole clamp bar with insulated metal fasteners, or mounting hardware 122 that allows them to be safe for mounting at this elevated height. The mounting concept optionally includes a non-conductive material of suitable temperature and mechanical integrity, such as Glastic®, as a bottom mounting plate. The toroid sits on a shock absorber of silicone rubber material of suitable temperature and mechanical integrity. In this example, the vibration isolator 440, such as silicone rubber, is about 0.125 inch thick with a woven fiber center to provide mechanical durability to the mounting. The toroid is held in place by a center hole clamp bar of Glastic® or other non-conductive material of suitable temperature and mechanical integrity. The clamp bar fits through the center hole of the toroid and preferably has a minimum of one hole on each end, two total holes, to allow fasteners to fasten the clamp bar to the bottom plate and pedestal or base plate. Beneath the center clamp bar is another shock absorbing piece of silicone rubber with the same properties as the bottom shock absorbing rubber. The clamp bar is torqued down on both sides using fasteners, such as standard metal fasteners. The fasteners are preferably an insulated non-conductive material of suitable temperature and mechanical integrity. The mounting system allows for mounting of the elevated pedestal inductors with the center hole parallel to the mounting chassis and allows the maximum surface area of the toroid to be exposed to the moving air, thus maximizing the efficiency of the thermal management system.

In addition, this mounting system allows for the two shock absorbing rubber or equivalent materials to both hold the toroid inductor in an upright position. The shock absorbing material also absorbs additional shock and vibration resulting during operation, transportation, or installation so that core material shock and winding shock is minimized.

Inductor Elements

The inductor 230 is further described herein. Preferably, the inductor includes a pressed powder highly permeable and linear core having a BH curve slope of about 11 $\Delta B/\Delta H$ surrounded by windings and/or an integrated cooling system.

Referring now to FIG. 6, the inductor 230 comprises a core 610 and a winding 620. The inductor 230 preferably includes any additional elements or features, such as other items required in manufacturing. The winding 620 is wrapped around the core 610. The core 610 provides mechanical support for the winding 620 and is characterized by a permeability for storing or transferring a magnetic field in response to current flowing through the winding 620. Herein, permeability is defined in terms of a slope of $\Delta B/\Delta H$. The core 610 and winding 620 are suitably disposed on or in a mount or housing 210 to support the core 610 in any suitable position and/or to conduct heat away from the core 610 and the winding 620.

The inductor core optionally provides mechanical support for the inductor winding and comprises any suitable core for providing the desired magnetic permeability and/or other characteristics. The configuration and materials of the core 610 are optionally selected according to any suitable criteria, such as a BH curve profile, permeability, availability, cost, operating characteristics in various environments, ability to withstand various conditions, heat generation, thermal aging, thermal impedance, thermal coefficient of expansion, curie temperature, tensile strength, core losses, and/or compression strength. For example, the core 610 is optionally configured to exhibit a selected permeability and BH curve.

For example, the core 610 is configured to exhibit low core losses under various operating conditions, such as in response to a high frequency pulse width modulation or harmonic ripple, compared to conventional materials. Conventional core materials are laminated silicon steel or conventional silicon iron steel designs. The inventor has determined that the core preferably comprises an iron powder material or multiple materials to provide a specific BH curve, described infra. The specified BH curve allows creation of inductors having: smaller components, reduced emissions, reduced core losses, and increased surface area in a given volume when compared to inductors using the above described traditional materials.

BH Curve

There are two quantities that physicists use to denote magnetic field, B and H. The vector field, H, is known among electrical engineers as the magnetic field intensity or magnetic field strength, which is also known as an auxiliary magnetic field or a magnetizing field. The vector field, H, is a function of applied current. The vector field, B, is known as magnetic flux density or magnetic induction and has the international system of units (SI units) of Teslas (T). Thus, a BH curve is induction, B, as a function of the magnetic field, H.

Inductor Core/Distributed Gap

In one exemplary embodiment, the core 610 comprises at least two materials. In one example, the core includes two materials, a magnetic material and a coating agent. In one case, the magnetic material includes a first transition series metal in elemental form and/or in any oxidation state. In a second case, the magnetic material is a form of iron. The second material is optionally a non-magnetic material and/or is a highly thermally conductive material, such as carbon, a carbon allotrope, and/or a form of carbon. A form of carbon includes any arrangement of elemental carbon and/or carbon bonded to one or more other types of atoms.

In one case, the magnetic material is present as particles and the particles are each coated with the coating agent to form coated particles. For example, particles of the magnetic material are each substantially coated with one, two, three, or more layers of a coating material, such as a form of carbon. The carbon provides a shock absorber affect, which minimized high frequency core loss from the inductor 230. In a preferred embodiment, particles of iron, or a form thereof, are coated with multiple layers of carbon to form carbon coated particles. The coated particles are optionally combined with a filler, such as an epoxy. The filler provides an average gap distance between the coated particles.

In another case, the magnetic material is present as a first layer in the form of particles and the particles are each at least partially coated, in a second layer, with the coating agent to form coated particles. The coated particles are subsequently coated with another layer of a magnetic material, which is optionally the first magnetic material, to form a three layer particle. The three layer particle is optionally coated with a fourth layer of a non-magnetic material, which is optionally the non-magnetic material of the second layer. The process is optionally repeated to form particles of n layers, where n is a positive integer, such as about 2, 3, 4, 5, 10, 15, or 20. The n layers optionally alternate between a magnetic layer and a non-magnetic layer. Optionally, the innermost particle of each coated particle is a non-magnetic particle.

The coated particles preferably have, with a probability of at least ninety percent, an average cross-sectional length of less than about one millimeter, one-tenth of a millimeter (100 µm), and/or one-hundredth of a millimeter (10 µm). While two or more coated particles in the core are optionally touching, the average gap distance between two coated particles is optionally a distance greater than zero and less than about one millimeter, one-tenth of a millimeter (100 µm), one-hundredth of a millimeter (10 µm), and/or one-thousandth of a millimeter (1 µm). With a large number of coated particles in the inductor 230, there exist a large number of gaps between two adjacent coated particles that are about evenly distributed within at least a portion of the inductor. The about evenly distributed gaps between particles in the inductor is optionally referred to as a distributed gap.

In one exemplary manufacturing process, the carbon coated particles are mixed with a filler, such as an epoxy. The resulting mixture is optionally pressed into a shape, such as an inductor shape, an about toroidal shape, an about annular shape, or an about doughnut shape. Optionally, during the pressing process, the filler or epoxy is melted out. The magnetic path in the inductor goes through the distributed gaps. Small air pockets optionally exist in the inductor 230, such as between the coated particles. In use, the magnetic field goes from coated particle to coated particle through the filler gaps and/or through the air gaps.

The distributed gap nature of the inductor 230 yields an about even Eddy loss, gap loss, or magnetic flux loss. Substantially even distribution of the bonding agent within the iron powder of the core results in the equally distributed gap of the core. The resultant core loss at the switching frequencies of the electrical switches substantially reduces core losses when compared to silicon iron steel used in conventional iron core inductor design.

Further, conventional inductor construction requires gaps in the magnetic path of the steel lamination, which are typically outside the coil construction and are, therefore, unshielded from emitting flux, causing electromagnetically interfering radiation. The electromagnetic radiation can adversely affect the electrical system.

The distributed gaps in the magnetic path of the present core 610 material are microscopic and substantially evenly distributed throughout the core 610. The smaller flux energy at each gap location is also surrounded by a winding 620 which functions as an electromagnetic shield to contain the flux energy. Thus, a pressed powder core surrounded by windings results in substantially reduced electromagnetic emissions.

Figure 7:
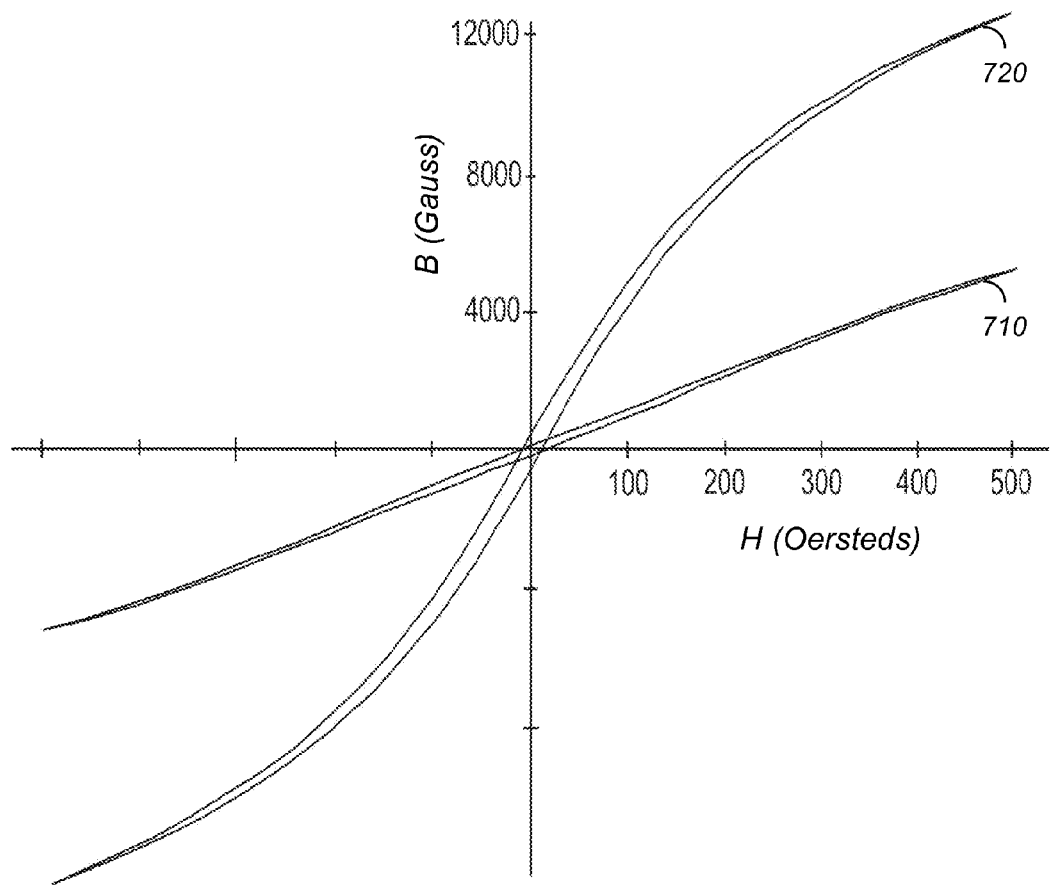
FIG. 7 provides exemplary BH curve results.

Referring now to FIG. 7 and to Table 1, preferred inductance, B, levels as a function of magnetic force strength are provided. The core 610 material preferably comprises: an inductance of about −4400 to 4400 B over a range of about −400 to 400 H with a slope of about 11 $\Delta B/\Delta H$. Herein, permeability refers to the slope of a BH curve and has units of $\Delta B/\Delta H$. Core materials having a substantially linear BH curve with $\Delta B/\Delta H$ in the range of ten to twelve are usable in a preferred embodiment. Less preferably, core materials having a substantially linear BH curve with a permeability, $\Delta B/\Delta H$, in the range of nine to thirteen are acceptable. Two exemplary BH curves 710, 720 are provided in FIG. 7.

TABLE 1

BH Response
(Permeability of Eleven)

| B (Tesla/Gauss) | H (Oersted) |
| --- | --- |
| −4400 | −400 |
| −2200 | −200 |
| −1100 | −100 |
| 1100 | 100 |
| 2200 | 200 |
| 4400 | 400 |

In one embodiment, the core 610 material exhibits a substantially linear flux density response to magnetizing forces over a large range with very low residual flux, $B_R$. The core 610 preferably provides inductance stability over a range of changing potential loads, from low load to full load to overload.

The core 610 is preferably configured in an about toroidal, about circular, doughnut, or annular shape where the toroid is of any size. The configuration of the core 610 is preferably selected to maximize the inductance rating, $A_L$, of the core 610, enhance heat dissipation, reduce emissions, facilitate winding, and/or reduce residual capacitances.

Medium Voltage

Herein, a corona potential is the potential for long term breakdown of winding wire insulation due to high electric potentials between winding turns winding a mid-level power inductor in a converter system. The high electric potential creates ozone, which breaks down insulation coating the winding wire and results in degraded performance or failure of the inductor.

Herein, power is described as a function of voltage. Typically, homes and buildings use low voltage power supplies, which range from about 100 to 690 volts. Large industry, such as steel mills, chemical plants, paper mills, and other large industrial processes optionally use medium voltage filter inductors and/or medium voltage power supplies. Herein, medium voltage power refers to power having about 1,500 to 35,000 volts or optionally about 2,000 to 5,000 volts. High voltage power refers to high voltage systems or high voltage power lines, which operate from about 20,000 to 150,000 volts.

In one embodiment, a power converter method and apparatus is described, which is optionally part of a filtering method and apparatus. The inductor is configured with inductor winding spacers, such as a main inductor spacer and/or inductor segmenting winding spacers. The spacers are used to space winding turns of a winding coil about an inductor. The insulation of the inductor spacer minimizes energy transfer between windings and thus minimizes corona potential, formation of corrosive ozone through ionization of oxygen, correlated breakdown of insulation on the winding wire, and/or electrical shorts in the inductor.

More particularly, the inductor configured with winding spacers uses the winding spacers to separate winding turns of a winding wire about the core of the inductor, which reduces the volts per turn. The reduction in volts per turn minimizes corona potential of the inductor. Additional electromagnetic components, such as capacitors, are integrated with the inductor configured with winding spacers to facilitate power processing and/or power conversion. The inductors configured with winding spacers described herein are designed to operate on medium voltage systems and to minimize corona potential in a mid-level power converter. The inductors configured with winding spacers, described infra, are optionally used on low and/or high voltage systems.

Inductor Winding Spacers

In still yet another embodiment, the inductor 230 is optionally configured with inductor winding spacers. Generally, the inductor winding spacers or simply winding spacers are used to space winding turns to reduce corona potential, described infra.

For clarity of presentation, initially the inductor winding is described. Subsequently, the corona potential is further described. Then the inductor spacers are described. Finally, the use of the inductor spacers to reduce corona potential through controlled winding with winding turns separated by the insulating inductor spacers is described.

Inductor Winding

The inductor 230 includes a core 610 that is wound with a winding 620. The winding 620 comprises a conductor for conducting electrical current through the inductor 230. The winding 620 optionally comprises any suitable material for conducting current, such as conventional wire, foil, twisted cables, and the like formed of copper, aluminum, gold, silver, or other electrically conductive material or alloy at any temperature.

Preferably, the winding 620 comprises a set of wires, such as copper magnet wires, wound around the core 610 in one or more layers. Preferably, each wire of the set of wires is wound through a number of turns about the core 610, where each element of the set of wires initiates the winding at a winding input terminal and completes the winding at a winding output terminal. Optionally, the set of wires forming the winding 620 nearly entirely covers the core 610, such as a toroidal shaped core. Leakage flux is inhibited from exiting the inductor 230 by the winding 620, thus reducing electromagnetic emissions, as the windings 620 function as a shield against such emissions. In addition, the soft radii in the geometry of the windings 620 and the core 610 material are less prone to leakage flux than conventional configurations. Stated again, the toroidal or doughnut shaped core provides a curved outer surface upon which the windings are wound. The curved surface allows about uniform support for the windings and minimizes and/or reduced gaps between the winding and the core.

Corona Potential

A corona potential is the potential for long term breakdown of winding wire insulation due to the high electric potentials between winding turns near the inductor 230, which creates ozone. The ozone breaks down insulation coating the winding wire, results in degraded performance, and/or results in failure of the inductor 230.

Inductor Spacers

The inductor 230 is optionally configured with inductor winding spacers, such as a main inductor spacer 810 and/or inductor segmenting winding spacers 820. Generally, the spacers are used to space winding turns, described infra. Collectively, the main inductor spacer 810 and segmenting winding spacers 820 are referred to herein as inductor spacers. Generally, the inductor spacer comprises a non-conductive material, such as air, a plastic, or a dielectric material. The insulation of the inductor spacer minimizes energy transfer between windings and thus minimizes or reduces corona potential, formation of corrosive ozone through ionization of oxygen, correlated breakdown of insulation on the winding wire, and/or electrical shorts in the inductor 230.

A first low power example, of about 690 volts, is used to illustrate need for a main inductor spacer 810 and lack of need for inductor segmenting winding spacers 820 in a low power transformer. In this example, the inductor 230 includes a core 610 wound twenty times with a winding 620, where each turn of the winding about the core is about evenly separated by rotating the core 610 about eighteen degrees (360 degrees/20 turns) for each turn of the winding. If each turn of the winding 620 about the core results in 34.5 volts, then the potential between turns is only about 34.5 volts, which is not of sufficient magnitude to result in a corona potential. Hence, inductor segmentation winding spacers 820 are not required in a low power inductor/conductor system. However, potential between the winding input terminal and the winding output terminal is about 690 volts (34.5 volts times 20 turns). More specifically, the potential between a winding wire near the input terminal and the winding wire near the output terminal is about 690 volts, which can result in corona potential. To minimize the corona potential, an insulating main inductor spacer 810 is placed between the input terminal and the output terminal. The insulating property of the main inductor spacer 810 minimizes or prevents shorts in the system, as described supra.

A second medium power example illustrates the need for both a main inductor spacer 810 and inductor segmenting winding spacers 820 in a medium power system. In this example, the inductor 230 includes a core 610 wound 20 times with a winding 620, where each turn of the winding about the core is about evenly separated by rotating the core 610 about 18 degrees (360 degrees/20 turns) for each turn of the winding. If each turn of the winding 620 about the core results in about 225 volts, then the potential between individual turns is about 225 volts, which is of sufficient magnitude to result in a corona potential. Placement of an inductor winding spacer 820 between each turn reduces the corona potential between individual turns of the winding. Further, potential between the winding input terminal and the winding output terminal is about 4500 volts (225 volts times 20 turns). More specifically, the potential between a winding wire near the input terminal and the winding wire near the output terminal is about 4500 volts, which results in corona potential. To minimize the corona potential, an insulating main inductor spacer 810 is placed between the input terminal and the output terminal. Since the potential between winding wires near the input terminal and output terminal is larger (4500 volts) than the potential between individual turns of wire (225 volts), the main inductor spacer 810 is preferably wider and/or has a greater insulation than the individual inductor segmenting winding spacers 820.

In a low power system, the main inductor spacer 810 is optionally about 0.125 inch in thickness. In a mid-level power system, the main inductor spacer is preferably about 0.375 to 0.500 inch in thickness. Optionally, the main inductor spacer 810 thickness is greater than about 0.125, 0.250, 0.375, 0.500, 0.625, or 0.850 inch. The main inductor spacer 810 is preferably thicker, or more insulating, than the individual segmenting winding spacers 820. Optionally, the individual segmenting winding spacers 820 are greater than about 0.0312, 0.0625, 0.125, 0.250, 0.375 inches thick. Generally, the main inductor spacer 810 has a greater thickness or cross-sectional width that yields a larger electrically insulating resistivity versus the cross-section or width of one of the individual segmenting winding spacers 820. Preferably, the electrical resistivity of the main inductor spacer 810 between the first turn of the winding wire proximate the input terminal and the terminal output turn proximate the output terminal is at least about 10, 20, 30, 40, 50, 60, 70, 80, 90, or 100 percent greater than the electrical resistivity of a given inductor segmenting winding spacer 820 separating two consecutive turns of the winding 620 about the core 610 of the inductor 230. The main inductor spacer 810 is optionally a first material and the inductor segmenting spacers are optionally a second material, where the first material is not the same material as the second material. The main inductor spacer 810 and inductor segmenting winding spacers 820 are further described, infra.

In yet another example, the converter operates at levels exceeding about 2000 volts at currents exceeding about 400 amperes. For instance, the converter operates at above about 1000, 2000, 3000, 4000, or 5000 volts at currents above any of about 500, 1000, or 1500 amperes. Preferably the converter operates at levels less than about 15,000 volts.

Figure 8:
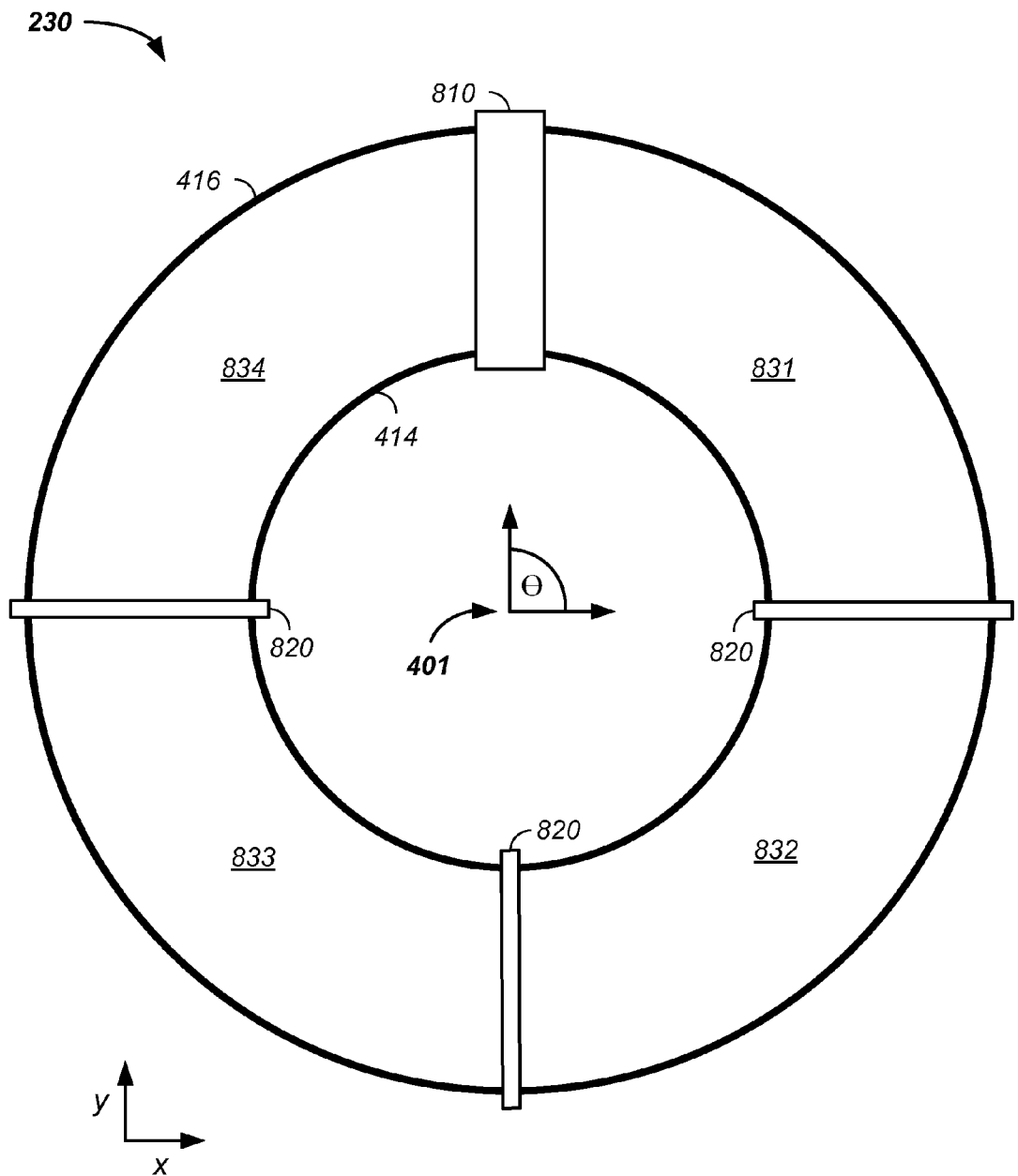
FIG. 8 illustrates a sectioned inductor.

Referring now to FIG. 8, an example of an inductor 230 configured with four spacers is illustrated. For clarity, the main inductor spacer 810 is positioned at the twelve o'clock position and the inductor segmenting winding spacers 820 are positioned relative to the main inductor winding spacer. The clock position used herein are for clarity of presentation. The spacers are optionally present at any position on the inductor and any coordinate system is optionally used. For example, referring still to FIG. 8, the three illustrated inductor segmenting winding spacers 820 are positioned at about the three o'clock, six o'clock, and nine o'clock positions. However, the main inductor spacer 810 is optionally present at any position and the inductor segmenting winding spacers 820 are positioned relative to the main inductor spacer 810. As illustrated, the four spacers segment the toroid into four sections. Particularly, the main inductor spacer 810 and the first inductor segmenting winding spacer at the three o'clock position create a first inductor section 831. The first of the inductor segmenting winding spacers at the three o'clock position and a second of the inductor segmenting winding spacers at the six o'clock position create a second inductor section 832. The second of the inductor segmenting winding spacers at the six o'clock position and a third of the inductor segmenting winding spacers at the nine o'clock position create a third inductor section 833. The third of the inductor segmenting winding spacers at the nine o'clock position and the main inductor spacer 810 at about the twelve o'clock position create a fourth inductor section 834. In this system, preferably a first turn of the winding 620 wraps the core 610 in the first inductor section 831, a second turn of the winding 620 wraps the core 610 in the second inductor section 832, a third turn of the winding 620 wraps the core 610 in the third inductor section 833, and a fourth turn of the winding 620 wraps the core 610 in the fourth inductor section 834. Generally, the number of inductor spacers 810 is set to create 2, 3, 4, 5, 6, 7, 8, 9, 10, 11, 12, 13, 14, 15, 16, 17, 18, 19, 20, or more inductor sections. Generally, the angle theta is the angle between two inductor sections from a central point 401 of the inductor 230.

Each of the spacers 810, 820 is optionally a ring about the core 610 or is a series of segments about forming a circumferential ring about the core 610.

Inductor spacers provide an insulating layer between turns of the winding. Still referring to FIG. 8, an individual spacer 810, 820 preferably circumferentially surrounds the core 610. Preferably, the individual spacers 810, 820 extend radially outwardly from an outer surface of the core 610. The spacers 810, 820 optionally contact and/or proximally contact the core 610, such as via an adhesive layer or via a spring loaded fit.

Figure 9:
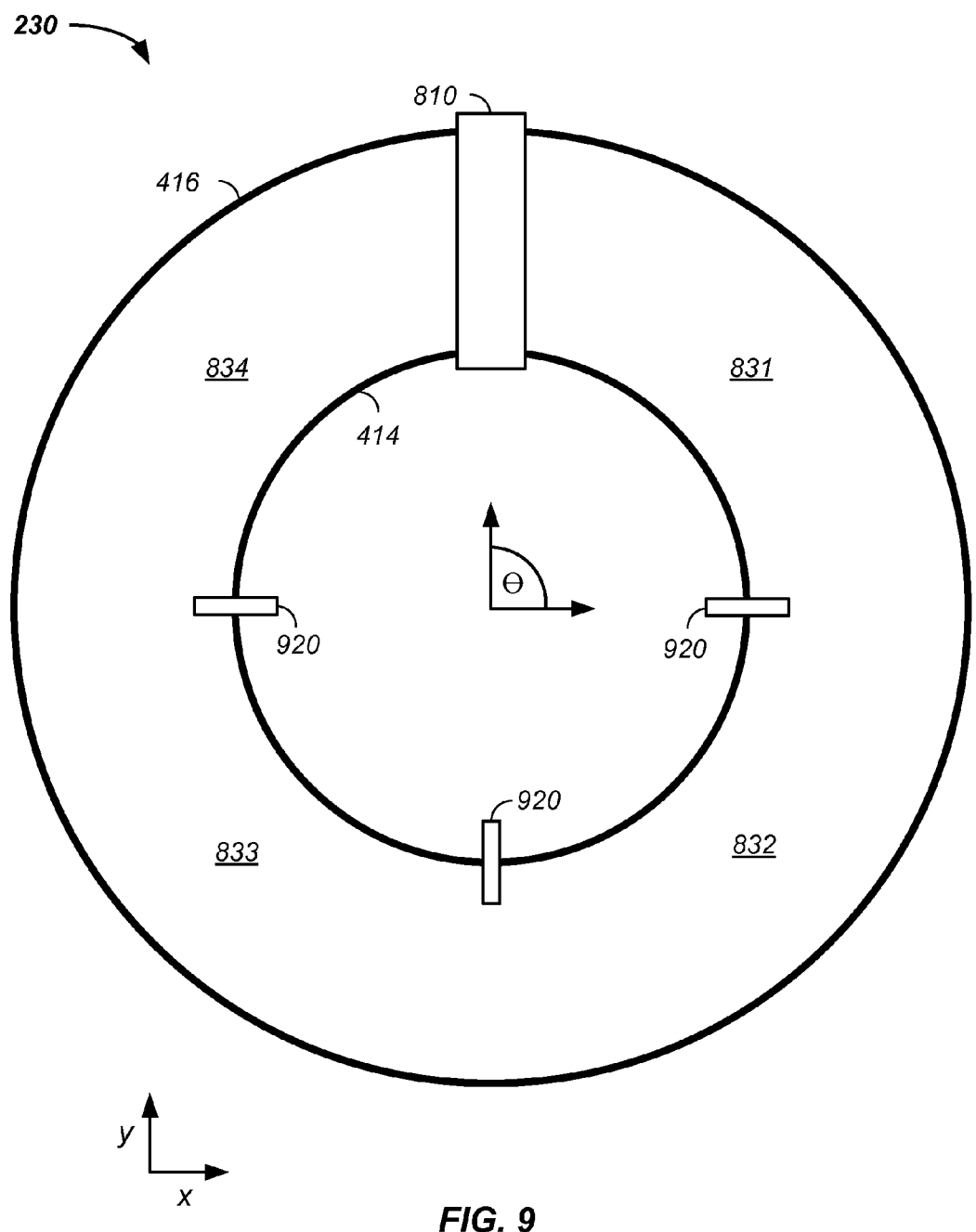
FIG. 9 illustrates partial circumferential inductor winding spacers.

Referring now to FIG. 9, optionally one or more of the spacers do not entirely circumferentially surround the core 610. For example, short spacers 920 separate the individual turns of the winding at least in the central aperture 412 of the core 610. In the illustrated example, the short spacers 920 separate the individual turns of the winding in the central aperture 412 of the core 610 and along a portion of the inductor faces 417, where geometry dictates that the distance between individual turns of the winding 620 is small relative to average distance between the wires at the outer face 416.

Figure 10:
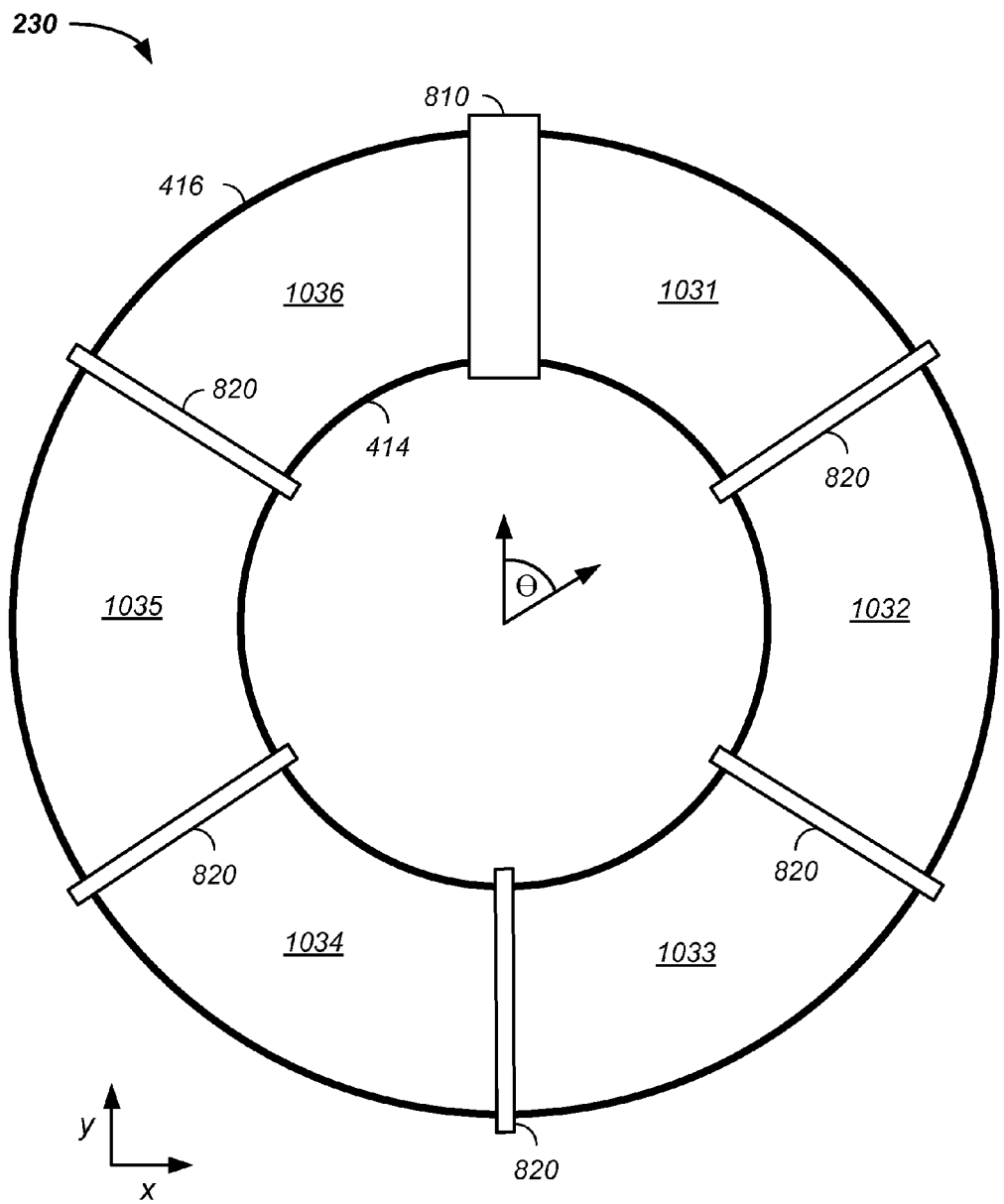
FIG. 10 illustrates an inductor with multiple winding spacers.
Figure 11:
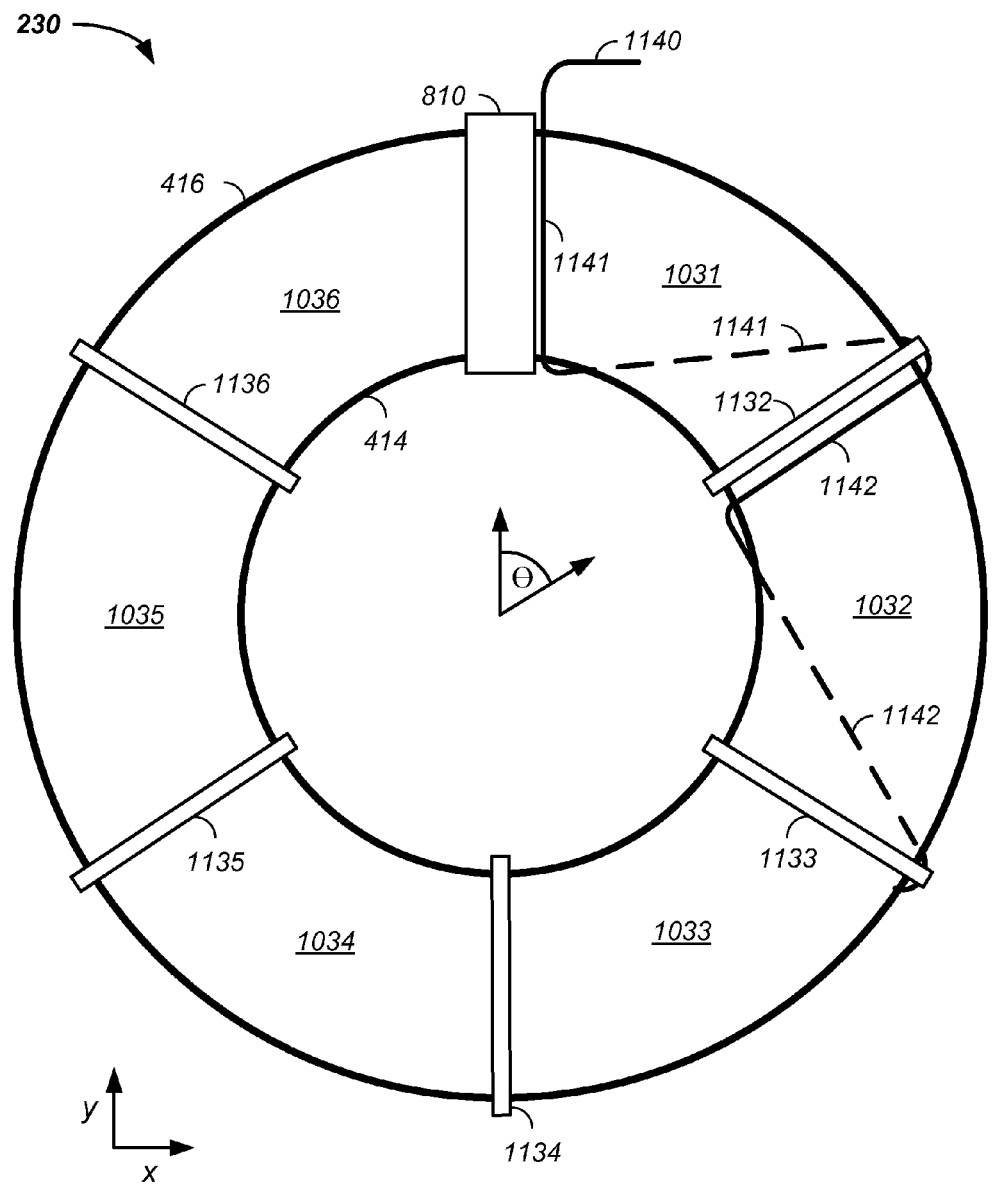
FIG. 11 illustrates two winding turns on an inductor.
Figure 12:
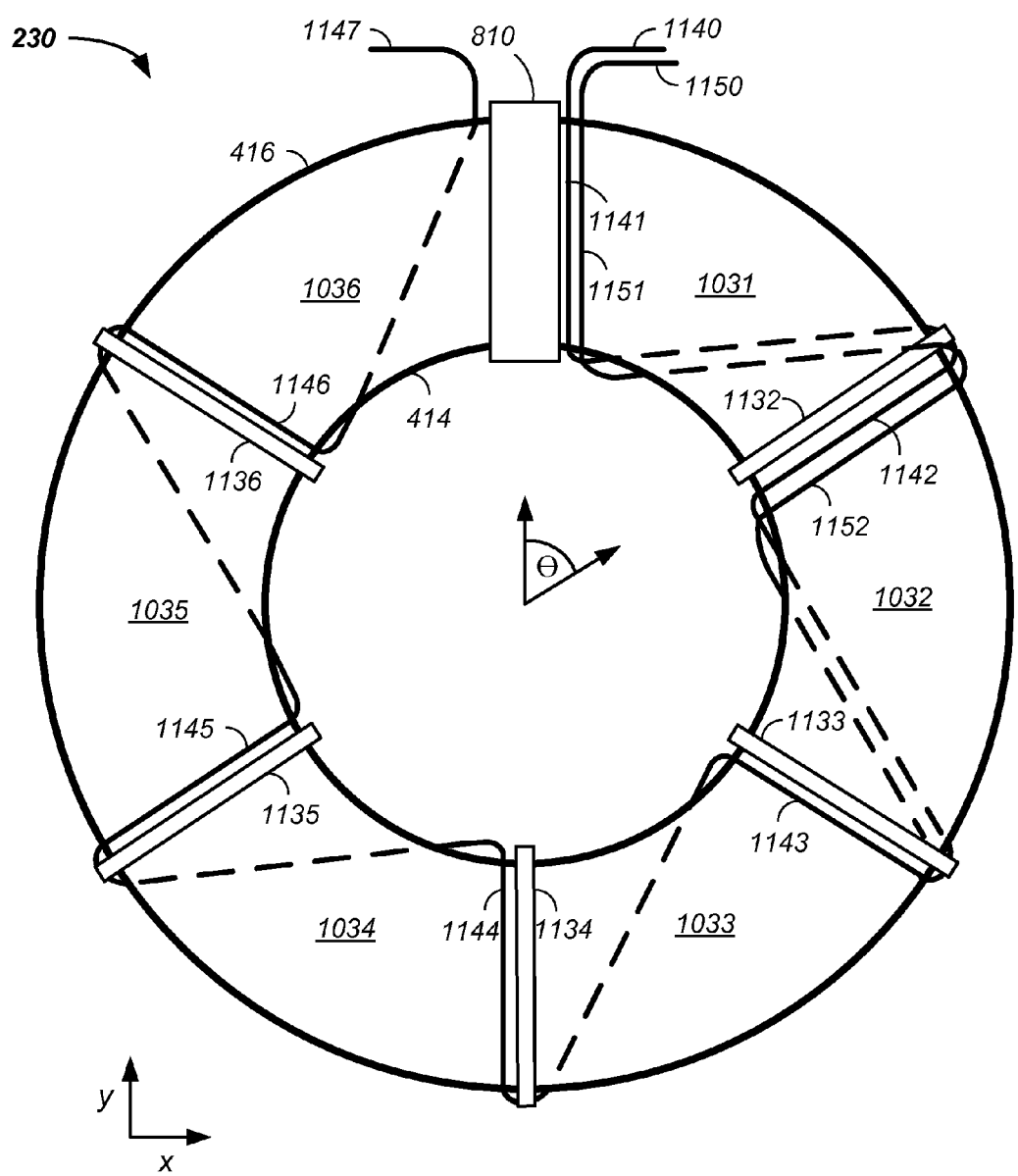
FIG. 12 illustrates multiple wires winding an inductor.

Referring now to FIGS. 10, 11, and 12, an example of an inductor 230 segmented into six sections using a main inductor spacer 810 and a set of inductor segmenting winding spacers 820 is provided. Referring now to FIG. 10, the main inductor spacer 810 and five inductor segmenting winding spacers 820 segment the periphery of the core into six regions 1031, 1032, 1033, 1034, 1035, and 1036.

Referring now to FIG. 11, two turns of a first winding are illustrated. A first winding wire 1140 is wound around the first region core 1031 in a first turn 1141. Similarly, the winding 620 is continued in a second turn 1142 about a second region of the core 1032. The first turn 1141 and the second turn 1142 are separated by a first segmenting winding spacer 1132.

Referring now to FIG. 12, six turns of a first winding are illustrated. Continuing from FIG. 11, the winding 620 is continued in a third turn 1143, a fourth turn 1144, a fifth turn 1145, and a sixth turn 1146. The first and second turns 1141, 1142 are separated by the first segmenting winding spacer 1132, the second and third turns 1142, 1143 are separated by the second segmenting winding spacer 1133, the third and fourth turns 1143, 1144 are separated by the third segmenting winding spacer 1134, the fourth and fifth turns 1144, 1145 are separated by the fourth segmenting winding spacer 1135, and the fifth and sixth turns 1145, 1146 are separated by the fifth segmenting winding spacer 1136. Further, the first and sixth turns 1141, 1146 are separated by the main inductor spacer 810. Similarly, the first two turns 1151, 1152 of a second winding wire 1150 are illustrated, that are separated by the first segmenting winding spacer 1132. Generally, any number of winding wires are wrapped or layered to form the winding 610 about the core 610 of the inductor 230. An advantage of the system is that in a given inductor section, such as the first inductor section 1031, each of the winding wires are at about the same potential, which yields essentially no risk of corona potential within a given inductor section. Generally, an $m^{th}$ turn of an $n^{th}$ wire are within about 5, 10, 15, 30, 45, or 60 degrees of each other at any position on the inductor, such as at about the six o' clock position.

For a given winding wire, the first turn of the winding wire, such as the first turn 1141, proximate the input terminal is referred to herein as an initial input turn. For the given wire, the last turn of the wire before the output terminal, such as the sixth turn 1146, is referred to herein as the terminal output turn. The initial input turn and the terminal output turn are preferably separated by the main inductor spacer.

A given inductor segmenting winding spacer 820 optionally separates two consecutive winding turns of a winding wire winding the core 610 of the inductor 230.

Figure 13:
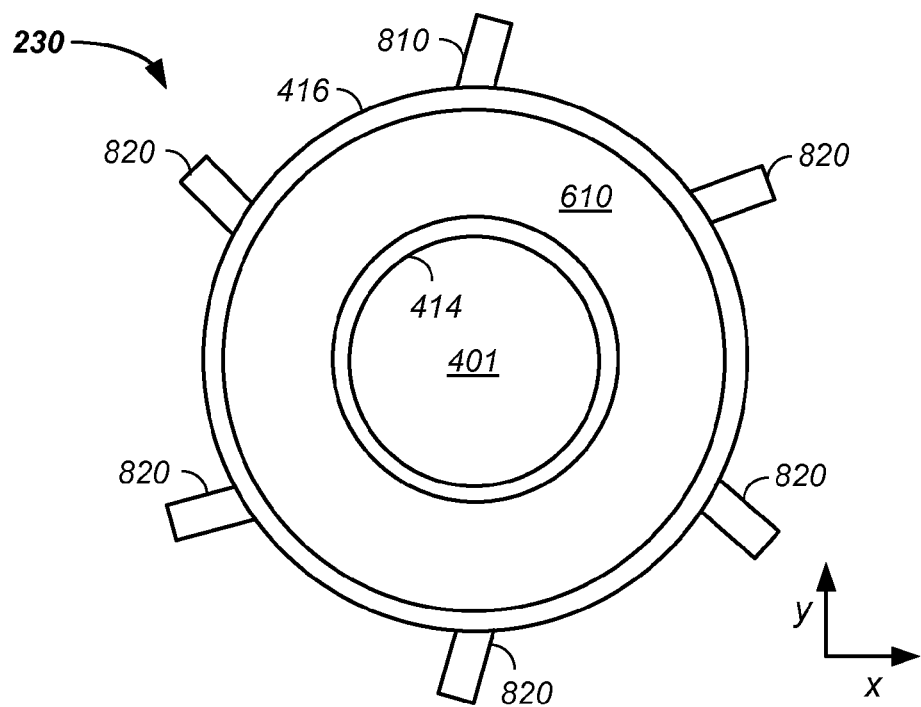
FIG. 13 illustrates tilted winding spacers on an inductor.
Figure 14:
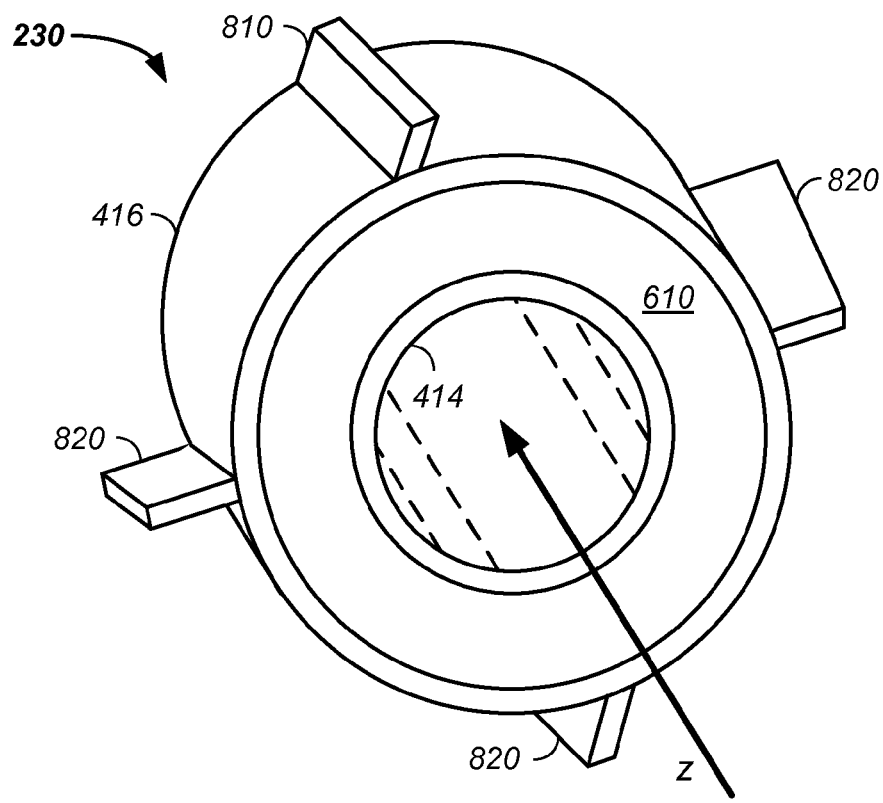
FIG. 14 illustrates tilted and rotated winding spacers on an inductor.

Referring now to FIG. 13, one embodiment of manufacture rotates the core 610 as one or more winding wires are wrapped about the core 610. For example, for a four turn winding, the core is rotated about 90 degrees with each turn. During the winding process, the core 610 is optionally rotated at an about constant rate or is rotated and stopped with each turn. To aid in the winding process, the spacers are optionally tilted, rotated, or tilted and rotated. Referring now to FIG. 13, inductor spacers 810, 820 are illustrated that are tilted relative to a spacer about parallel to the outer face 416 of the inductor 230. For clarity of presentation, the inductor spacers are only illustrated on the outer edge of the core 610. Tilted spacers on the outer edge of the inductor 230 have a length that is aligned with the z-axis, but are tilted along the x- and/or y-axes. More specifically, as the spacer 810, 820 extends radially outward from the core 610, the spacer 810, 820 position changes in terms of both the x- and y-axes locations. Referring now to FIG. 14, inductor spacers are illustrated that are both tilted and rotated. For clarity of presentation, the inductor spacers are only illustrated on the outer edge of the core 610. Tilted and rotated spacers on the outer edge of the core 610 have both a length that is rotated relative to the z-axis and a height that is tilted relative to the x- and/or y-axes, as described supra.

Capacitor

Referring again to FIG. 2, capacitors 250 are used with inductors 230 to create a filter to remove harmonic distortion from current and voltage waveforms. A buss bar carries power from one point to another. The capacitor buss bar 260 mounting system minimizes space requirements and optimizes packaging. The buss bars use a toroid/heat sink integrated system solution, THISS®, (CTM Magnetics, Tempe, Ariz.) to filter output power 150 and customer generated input power 154. The efficient filter output terminal layout described herein minimizes the copper cross section necessary for the capacitor buss bars 260. The copper cross section is minimized for the capacitor buss bar by sending the bulk of the current directly to the output terminals 221, 223, 225. In these circuits, the current carrying capacity of the capacitor bus conductor is a small fraction of the full approximate line frequency load or fundamental frequency current sent to the output load via the output terminals 221, 223, 225. The termination of the THISS® technology filter inductor is integrated to the capacitor bank for each phase of the system. These buss bars are optionally manufactured out of any suitable material and are any suitable shape. For instance, the buss bars are optionally a flat strip or a hollow tube. In one example, flat strips of tinned copper with threaded inserts or tapped threaded holes are used for both mounting the capacitors mechanically as well as providing electrical connection to each capacitor. This system optimizes the packaging efficiency of the capacitors by mounting them vertically and staggering each capacitor from each side of the buss bar for maximum density in the vertical dimension. A common neutral buss bar or flex cable 265 is used between two phases to further reduce copper quantity and to minimize size. A jumper buss bar connects this common neutral point to another phase efficiently, such as through use of an about flat strip of copper. Connection fittings designed to reduce radio-frequency interference and power loss are optionally used. The buss bars are optionally designed for phase matching and for connecting to existing transmission apparatus. The buss bars optionally use a mechanical support spacer, 270, made from non magnetic, non conductive material with adequate thermal and mechanical properties, such as a suitable epoxy and glass combination, a Glastic® or a Garolite material. The integrated output terminal buss bars provide for material handling of the filter assembly as well as connection to the sine wave filtered load or motor. Though a three phase implementation is displayed, the implementation is readily adapted to integrate with other power systems.

Referring now to FIG. 15, an additional example of a capacitor bank 1500 is provided. In this example, a three phase system containing five total buss bars 260 including a common neutral buss bar 265 is provided. The illustrated system contains seven columns and three rows of capacitors 250 per phase or twenty-one capacitors per phase for each of three phases, U1, V1, W1. Spacers maintain separation of the component capacitors. A shared neutral point 270 illustrates two phases sharing a single shared neutral bus.

Cooling

In still yet another embodiment, the inductor 230 is preferably in direct contact with a coolant, such as immersed in a non-conductive liquid coolant. The coolant absorbs heat energy from the toroid shaped inductor and preferably removes the heat to a heat exchanger. The heat exchanger radiates the heat outside of the sealed inductor enclosure. The process of heat removal transfer allows the inductor to maintain an about steady state temperature under load.

For example, an inductor 230 with an annular core, a doughnut shaped inductor, an inductor with a toroidal core, or substantially circular shaped inductor is at least partially immersed in a coolant, where the coolant is in intimate and direct thermal contact with a magnet wire, a winding coating, or the windings 610 about a core of the inductor 230. Optionally, the inductor 230 is fully immersed or sunk in the coolant. Due to the direct contact of the coolant with the magnet wire or a coating on the magnet wire, the coolant is substantially non-conducting. For example, an annular shaped inductor is fully immersed in an insulating coolant that is in intimate thermal contact with the magnet wire heat of the toroid surface area.

The coolant comprises any appropriate coolant, such as a gas, liquid, or suspended solid. For example, the coolant optionally comprises: a non-conducting liquid, a transformer oil, a mineral oil, a colligative agent, a fluorocarbon, a chlorocarbon, a fluorochlorocarbon, a deionized water/alcohol mixture, or a mixture of non-conducting liquids. Less preferably, the coolant is de-ionized water. Due to pinholes in the coating on the magnet wire, slow leakage of ions into the de-ionized water results in an electrically conductive coolant, which would short circuit the system. Hence, if de-ionized water is used as a coolant, then the coating should prevent ion transport. Alternatively, the de-ionized cooling water is periodically filtered and/or changed. Optionally, an oxygen absorber is added into the coolant, which prevents ozonation of the oxygen due the removal of the oxygen from the coolant.

Figure 16:
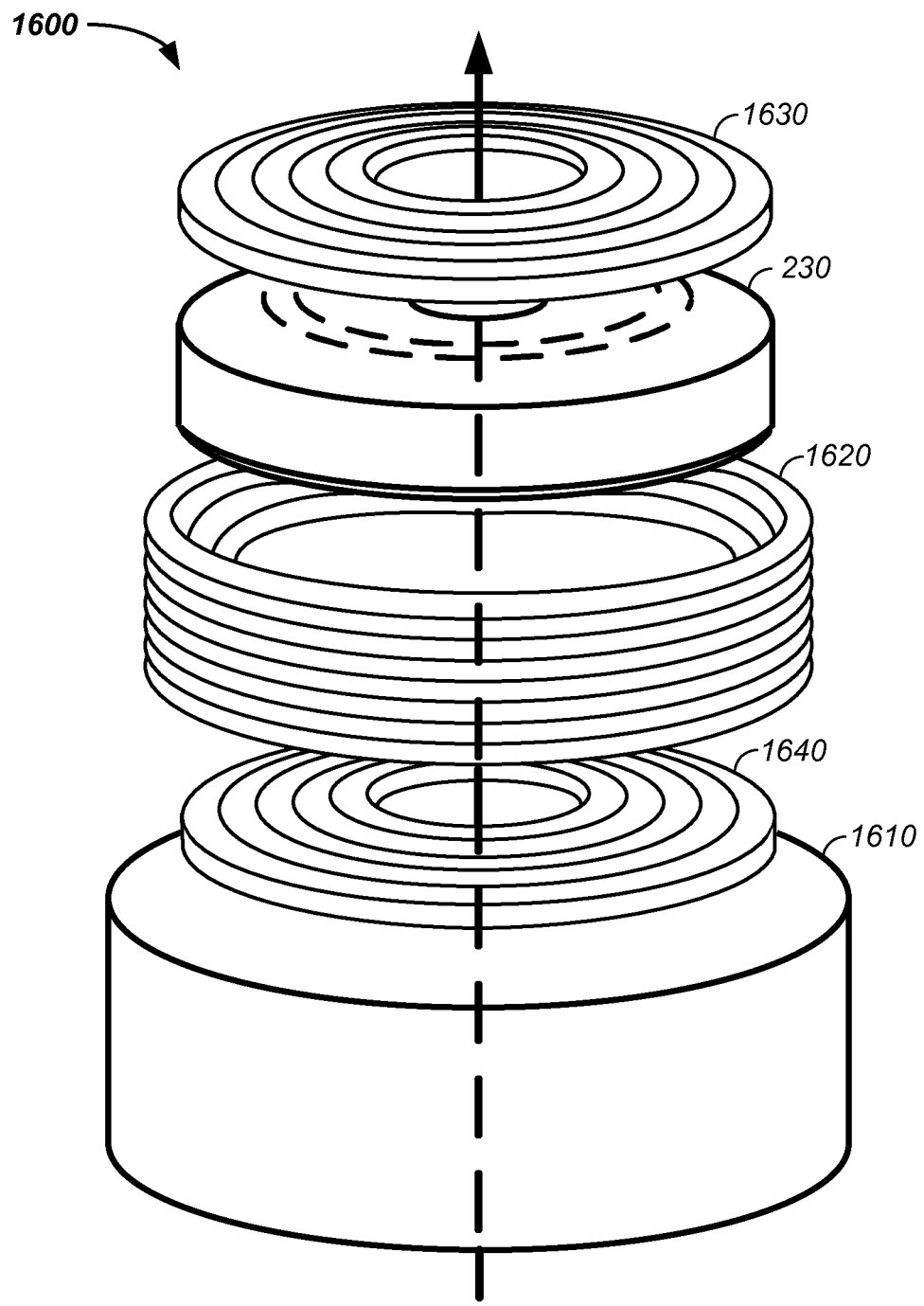
FIG. 16 illustrates an inductor cooling system.

Referring now to FIG. 16, an example of a liquid cooled induction system 1600 is provided. In the illustrated example, an inductor 230 is placed into a cooling liquid container 1610. The container 1610 is preferably enclosed, but at least holds a coolant. The coolant is preferably in direct contact with the inductor 230. Optionally, the coolant directly contacts at least a portion of the core 610 of the inductor 230, such as neat the input terminal and/or the output terminal. Further, the container 1610 preferably has mounting pads designed to hold the inductor 230 off of the surface of the container 1610 to increase coolant contact with the inductor 230. For example, the inductor 230 preferably has feet that allow for coolant contact with a bottom side of the inductor 230 to further facilitate heat transfer from the inductor to the cooling fluid.

Heat from the coolant is preferably removed via a heat exchanger. In one example, the coolant flows through an exit path, through a heat exchanger, such as a radiator, and is returned to the container 1610 via a return path. Optionally a fan is used to remove heat from the heat exchanger. Typically, a pump is used in the circulating path to move the coolant.

Still referring to FIG. 16, optionally a cooling line is used to cool the coolant about the inductor 230. Optionally, the cooling line is attached to a radiator or outside flow through cooling source. Coolant optionally flows through a cooling coil:

- circumferentially surrounding or making at least one cooling line turn 1620 or circumferential turn about the outer face 416 of the inductor 230 or on an inductor edge;
- forming a path, such as an about concentrically expanding upper ring 1630, with subsequent turns of the cooling line forming an upper cooling surface about parallel to the inductor front face 418;
- forming a path, such as an about concentrically expanding lower ring 1640, with subsequent turns of the cooling line forming a lower cooling surface about parallel to the inductor back face 419; and
- a cooling line running through the inductor 230 using a non electrically conducting cooling coil or cooling coil segment.

Optionally, the coolant flows sequentially through one or more of the expanding upper ring 1630, the cooling line turn 1620, and the expanding lower ring 1640 or vise-versa. Optionally, parallel cooling lines run about, through, and/or near the inductor 230.

The particular implementations shown and described are illustrative of the invention and its best mode and are not intended to otherwise limit the scope of the present invention in any way. Indeed, for the sake of brevity, conventional manufacturing, connection, preparation, and other functional aspects of the system may not be described in detail. While single PWM frequency, single voltage, single power modules, in differing orientations and configurations have been discussed, adaptations and multiple frequencies, voltages, and modules may be implemented in accordance with various aspects of the present invention. Furthermore, the connecting lines shown in the various figures are intended to represent exemplary functional relationships and/or physical couplings between the various elements. Many alternative or additional functional relationships or physical connections may be present in a practical system.

In the foregoing description, the invention has been described with reference to specific exemplary embodiments; however, it will be appreciated that various modifications and changes may be made without departing from the scope of the present invention as set forth herein. The description and figures are to be regarded in an illustrative manner, rather than a restrictive one and all such modifications are intended to be included within the scope of the present invention. Accordingly, the scope of the invention should be determined by the generic embodiments described herein and their legal equivalents rather than by merely the specific examples described above. For example, the steps recited in any method or process embodiment may be executed in any order and are not limited to the explicit order presented in the specific examples. Additionally, the components and/or elements recited in any apparatus embodiment may be assembled or otherwise operationally configured in a variety of permutations to produce substantially the same result as the present invention and are accordingly not limited to the specific configuration recited in the specific examples.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

Although the invention has been described herein with reference to certain preferred embodiments, one skilled in the art will readily appreciate that other applications may be substituted for those set forth herein without departing from the spirit and scope of the present invention. Accordingly, the invention should only be limited by the Claims included below.

The invention claimed is:

1. A method for manufacture of an apparatus configured for processing power, comprising the steps of:
    providing a plurality of coated magnetic particles, at least ninety percent of said coated magnetic particles each comprising:
        a magnetic particle core; and
        a non-magnetic coating substantially covering said magnetic particle core;
    mixing said coated magnetic particles with a filler;
    pressing said coated magnetic particles and said filler into a shape to form an inductor core, said inductor core configured to filter power of at least one thousand volts; and
    wrapping said inductor core with a winding, wherein at least three individual turns of said winding respectively pass between at least three inductor winding spacers, said winding spacers proximately contacting and extending radially outward from an outer surface of said inductor core, wherein said inductor winding spacers segment an outer surface of said inductor core into sections.

2. The method of claim 1, further comprising the step of:
    melting out a portion of said filler to form an average gap distance between two adjacent particles of said coated magnetic particles of less than about one millimeter.

3. The method of claim 1, said shape comprising:
    a substantially annular shape.

4. The method of claim 3, said inductor core configured to filter high frequency noise comprising frequencies over about five hundred Hertz from power of at least three thousand volts.

* * * * *